(12) United States Patent
Tokairin et al.

(10) Patent No.: US 7,565,127 B2
(45) Date of Patent: Jul. 21, 2009

(54) SIGNAL PROCESSING UNIT

(75) Inventors: Takashi Tokairin, Tokyo (JP); Noriaki Matsuno, Tokyo (JP)

(73) Assignee: NEC Corporation (JP)

( * ) Notice: Subject to any disclaimer, the term of this patent is extended or adjusted under 35 U.S.C. 154(b) by 467 days.

(21) Appl. No.: 11/569,117

(22) PCT Filed: Apr. 14, 2005

(86) PCT No.: PCT/JP2005/007200

§ 371 (c)(1),
(2), (4) Date: Nov. 14, 2006

(87) PCT Pub. No.: WO2005/112282

PCT Pub. Date: Nov. 24, 2005

(65) Prior Publication Data

US 2008/0090545 A1    Apr. 17, 2008

(30) Foreign Application Priority Data

May 14, 2004    (JP) ............................. 2004-145729

(51) Int. Cl.
*H04B 1/10*    (2006.01)
*H04B 1/16*    (2006.01)

(52) U.S. Cl. ................... 455/296; 455/307; 455/334; 455/343.1

(58) Field of Classification Search ............... 455/296, 455/299, 307, 311, 312, 334, 343.1
See application file for complete search history.

(56) References Cited

U.S. PATENT DOCUMENTS 6,114,243 A * 9/2000 Gupta et al. ............... 438/687

| 6,593,803 | B2 * | 7/2003 | Yoshizawa | 327/553 |
| 7,110,734 | B2 * | 9/2006 | Mohindra | 455/234.1 |
| 7,171,185 | B2 * | 1/2007 | Matsumoto et al. | 455/324 |
| 2002/0097081 | A1 * | 7/2002 | Razavi et al. | 327/307 |
| 2003/0109241 | A1 | 6/2003 | Kim | |
| 2003/0203727 | A1 * | 10/2003 | Kluge et al. | 455/234.1 |

FOREIGN PATENT DOCUMENTS

| JP | 1996-316998 | 11/1996 |
| JP | 1999-186874 | 9/1999 |

(Continued)

OTHER PUBLICATIONS

B. Razavi, "A 2.4-GHz CMOS Receiver for TEEE 802.11 Wireless Lans's" IEEE JSSC, vol. 34 No. 10, pp. 1382-1385 Oct. 1999.

*Primary Examiner*—Duc M Nguyen
(74) *Attorney, Agent, or Firm*—Dickstein, Shapiro, LLP.

(57) ABSTRACT

A signal processing unit of the present invention includes: input terminal (21) to which an input signal is input; high-pass filter (23) for cutting off the DC component of the input signal; output terminal (22) for outputting a signal output from high-pass filter (23) as an output signal; determination element (26) for determining whether or not the voltage of the output signal falls out of a predetermined detection threshold range; and, switches (27,28) for connecting the output node of high-pass filter (23) to a power supply circuit when the voltage of the output signal is determined to fall out of the detection threshold range at determination element (26).

31 Claims, 25 Drawing Sheets

FOREIGN PATENT DOCUMENTS

| | | |
|---|---|---|
| JP | 2000-115740 | 4/2000 |
| JP | 2000-315960 | 11/2000 |
| JP | 2001-136461 | 5/2001 |
| JP | 2002-118443 | 4/2002 |
| JP | 2003-115779 | 4/2003 |
| JP | 2003-224488 | 8/2003 |

* cited by examiner

PRIOR ART

PRIOR ART

PRIOR ART

PRIOR ART

SIGNAL PROCESSING UNIT

TECHNICAL FIELD

The present invention relates to a signal processing unit applied to a direct conversion receiver or the like, and in particular relates to a signal processing unit which achieves both reduction of DC offset which dynamically varies depending on the surrounding environment and signal transmission without loss of the desired signal component.

BACKGROUND ART

FIG. 1 shows a typical configurational example of a conventional direct conversion receiver. An RF (Radio Frequency) signal received through an antenna not shown is input to input terminal 1 and amplified by low noise amplifier (to be referred to hereinbelow as LNA) 2, then is branched into two routes. The RF signals branched into two routes are mixed (multiplied) with local signals (to be referred to hereinbelow as LO signals) cos ωt and sin ωt that are input through local signal input terminals 4a and 4b, in down-conversion mixers (to be referred to hereinbelow as mixers) 3a and 3b, respectively, and down-converted. The LO signals cos ωt and sin ωt are signals having phases that are different by 90 degrees from each other, and the frequency of the LO signals cos ωt and sin ωt is set at the same frequency as the carrier frequency of a desired RF signal. In this way, baseband signals can be obtained by a single down-conversion with mixers 3a and 3b.

The baseband signals output from mixer 3a and 3b are converted into digital signals by variable-gain amplifiers 5a, 5b, 7a and 7b, low-pass filters (to be referred to hereinbelow as LPFs) 6a and 6b for channel section and analog/digital converters (to be referred to hereinbelow ADCs) 8a and 8b. The digital signals converted by ADCs 8a and 8b are processed by baseband signal processor (BB) 9. Gain controller (gain setter) 10 controls the gains of LNA 2 and variable-gain amplifiers 5a, 5b, 7a and 7b as appropriate, based on the result of the time slot, BER (bit error rate) data, reception intensity, etc., of the processed result by baseband signal processor 9.

In the aforementioned direct conversion receiver, before filtering out the components other than channel signal by LPFs 6a and 6b, mixers 3a and 3b perform down-conversion into baseband signals. Accordingly, under circumstances in which jamming waves exist, it is impossible to obtain high enough gain at the stages prior to mixers 3a and 3b. For this reason, the intensity of the desired signal after down-conversion through mixers 3a and 3b basically becomes weaker, hence the influence that DC offset exerts on the signal after down-conversion becomes relatively greater.

DC offset arises due to variations of mixers 3a and 3b. Other than this, several mechanisms that cause DC offset have been known.

Main mechanisms that generate DC offset in a conventional signal processing unit will be described using FIGS. 2 to 5. Here, in FIGS. 2 to 5, reference numeral 3 denotes 3a and 3b in FIG. 1 and reference numeral 4 denotes 4a and 4b in FIG. 1.

In the signal processing unit shown in FIG. 2, a LO signal input into mixer 3 from local signal input terminal 4 passes through path 11 due to leak etc., into the RF port of mixer 3, and the LO signals of the same source are mixed, to thereby generate a DC offset. This DC offset is so-called static offset, which will not vary depending on time.

In the signal processing unit shown in FIG. 3, a LO signal input from local signal input terminal 4 passes through path 12 and enters LNA 2 from the input terminal 1 side into the RF port of mixer 3, and the LO signals of the same source are mixed, to thereby generate a DC offset. The amount of this DC offset varies in accordance with the gain set at LNA 2. Accordingly, when the gain of LNA 2 is set up immediately after the start of reception of an RF signal, the amount of DC offset varies. Further, there is a case in which the LO signal that passes to input terminal 1 of LNA 2 flows back to the antenna and is radiated once to the space and then reenters LNA 2 and mixer 3 through the antenna. The DC offset in this case is a so-called dynamic DC offset, which varies the amount of DC offset in a dynamic manner depending on the surrounding environment.

In the signal processing unit shown in FIG. 4, part of the RF signal received by the antenna passes through route 13 and passes to the side of local signal input terminal 4 of mixer 3 so that RF signals of the same source are mixed to thereby generate the DC offset. This DC offset conspicuously appears when there is a strong jamming wave within the vicinity of the frequency range of the desired RF signal. Since the intensity of the received jamming wave varies, being affected by fading, etc., the DC offset shown in FIG. 4 is a dynamic DC offset.

In the signal processing unit shown in FIG. 5, part of the RF signal amplified by LNA 2 passes through route 14 and passes to the side of local signal input terminal 4 of mixer 3 so that RF signals of the same source are mixed to thereby generate the DC offset. This DC offset has both the property of a dynamic DC offset in which the amount of the DC offset varies dynamically, being affected by fading etc. and the property of varying the-amount of DC offset stepwise under the influence of the gain change of LNA 2. The amount of this DC offset also varies depending on the second-order distortion of mixer 3.

Next, techniques for canceling (removing) DC offset in the conventional signal processing unit will be described with reference to FIGS. 6 to 9. Here, in FIGS. 6 to 9, reference numeral 3 indicates 3a or 3b in FIG. 1, reference numeral 4 indicates 4a or 4b in FIG. 1, and reference numeral 5 indicates 5a or 5b in FIG. 1.

In the signal processing unit shown in FIG. 6, a capacitance 15 for cutting off the DC component of the signal output from mixer 3 is provided on the output side of mixer 3.

Similar to FIG. 6, in the signal processing unit shown in FIG. 7, high-pass filter (to be referred to hereinbelow as HPF) 16 for cutting off the DC component of the signal output from mixer 3 is provided on the output side of mixer 3. Capacitance 15 and HPF 16 both have the high-pass property for permitting only the frequency component having a cutoff frequency or greater to pass therethrough. Conventionally, the cutoff frequency of HPF 16 is selected low enough so that no desired component will be lost, and it is designed so as to be as high as about 0.1% of the transmission rate in the communications system to which the signal processing unit is applied (see [B. Razavi, "A 2.4-GHz CMOS Receiver for TEEE 802.11 Wireless LAN's" IEEE JSSC, Vol. 34 No. 10, pp. 1382-1385 October 1999]).

The signal processing units shown in FIGS. 6 and 7 still have the common drawbacks that there is a possibility that part of the desired component of the signal may be lost and that it becomes difficult to achieve both removal of DC offset and preservation of the desired signal component when the amount of DC offset varies with time.

That is, in order to deal with dynamic DC offset in which the amount of DC offset varies depending on time, it is necessary to set the cutoff frequency of HPF 16 higher. However, if the cutoff frequency of HPF 16 is set higher, the desired component of the signal will also be lost, so that BER may degrade to an impermissible level, depending on the modulation scheme of the received signal.

In the signal processing unit shown in FIG. 8, feedback element 17 for performing DC servo feedback is added to variable-gain amplifier 5. Variable-gain amplifier 5 and feedback element 17 have the combined function of an HPF and an amplifier. The signal processing unit shown in FIG. 8 has the same drawbacks as those of the signal processing units shown in FIGS. 6 and 7.

The signal processing unit shown in FIG. 9 adopts such a scheme in which the DC offset contained in the signal output from mixer 3 is taken in by ADC 18 and the amount of DC offset at signal processor 19 is detected, then the DC offset is cancelled by digital/analog converter (to be referred to hereinbelow as DAC) 20. Here, in FIG. 9, a feed-forward type configuration is shown but a feed-back type configuration may be possible.

There is one known method as in the above scheme, in which the amount of DC offset is detected within an undesired reception time slot and the signal for canceling the DC offset is fixed in a desired reception time slot. However, this scheme entails drawbacks in that hardware configuration becomes complex, a control signal for canceling DC offset in synchronism with a received time slot needs to be generated at the baseband signal processor and, in that, if a variation in DC offset occurs during the desired received time slot, it is impossible to deal with that variation, and with others.

As another conventional technology for canceling DC offset, there is a technology disclosed in Japanese Patent Application Laid-open 8-316998 (to be referred to hereinbelow as patent document 1). This technology is one that basically uses a HPF. The characteristics of this technology are that the received signal level (=received signal intensity) is monitored and if the monitored received signal level has varied greater than a predetermined value, the time constant of the HPF is shortened. If the received signal level varies, DC offset variation such as the following (1) and (2) will occur:
(1) variation in DC offset attributed to second-order distortion of the mixer; and
(2) variation in DC offset caused by gain switching of a variable-gain amplifier.

Accordingly, based on the technology disclosed in patent document 1, it is possible to deal with DC offset variations (1) and (2).

However, according to the technology disclosed in patent document 1, since variation in DC offset is indirectly observed in the form of a variation of the received signal level, there is the drawback that a suitable control cannot be always performed. That is, depending on the mechanism by which DC offset is generated in the signal processing unit and the setting conditions of the signal processing unit, there are possibilities that the time constant of the HPF is switched to be shorter even though that DC offset is unvaried and that the time constant remains long even though that DC offset is varied. Further, in the technology disclosed in patent document 1, a separate device for generating a signal for switching the time constant of the HPF based on the monitored received signal level is needed, so that there is the drawback that the hardware configuration becomes complicated.

As another conventional technology for canceling DC offset, there is a technology disclosed in Japanese Patent Application Laid-open 11-186874 (to be referred to hereinbelow as patent document 2). In this technology, an amplifier having differential inputs is provided; one terminal of this amplifier serves as a signal input terminal and the other terminal is supplied with a negative feedback signal from the differential output. A non-linear element which presents a low gain for a small amplitude signal and a high gain for a large amplitude signal is interposed in the negative feedback path. Based on this, it is disclosed that the response time for converging the DC level of the signal output from the signal processing unit can shortened.

However, in the technology disclosed in patent document 2, there is an obvious drawback that when responding the signal input to the signal processing unit contains a constant DC offset. For example, consider a case where the DC offset voltage contained in the input signal is much higher than the ideal middle-point potential and a desired signal component having a smaller amplitude than the DC offset has been superimposed over the signal. In this case, in the apparatus based on the technology disclosed by patent document 2, the DC voltage of the negative feedback signal also comes to have a voltage close to the aforementioned DC offset voltage or much higher than the ideal middle-point potential. That is, the DC level of the signal output from the non-linear element inserted in the negative feedback path becomes a voltage level rather apart from the ideal middle-point potential. As a result, this non-linear element takes a high-gain state so that the cutoff frequency of the HPF remains at a high level.

To sum up, in the technology disclosed in patent document 2, the time constant of the HPF is determined by the absolute value of the DC offset contained in the signal input to the signal processing unit. Accordingly, it is impossible to converge the DC level of the signal output from the signal processing unit and to keep the time constant of the HPF long.

As another conventional technology for canceling DC offset, there is a technology disclosed in Japanese Patent Application Laid-open 2003-224488 (to be referred to hereinbelow as patent document 3). This technology is one that uses a HPF. This technology is characterized in that if a case corresponds to any one of the following (1) to (4), the case is determined to be a period during which the DC offset is likely to be increased and the time constant of the HPF is set shorter than that at the time of normal operation, to thereby deal with DC offset variation:
(1) when the gain of a variable-gain amplifier is changed;
(2) a period after the power to the receiver has been activated;
(3) a period immediately after a circuit is started up during intermittent reception; and
(4) a period immediately after a different frequency measurement in a W-CDMA system has been started.

However, in the technology disclosed in patent document 3, since the cutoff frequency of the HPF is controlled by detecting any of the above (1) to (4), there is a possibility that the cutoff frequency of the HPF is switched even if there is no variation in DC offset. Further, a controller for switching the time constant of the HPF is needed, hence there occurs the drawback that the hardware configuration becomes complicated.

As has been described heretofore, in conventional technologies, it is impossible to achieve both countermeasures against dynamic DC offset and transmission without loss of the desired signal component at the same time.

DISCLOSURE OF THE INVENTION

The object of the present invention to provide a signal processing unit which can achieve both countermeasures against dynamic DC offset and signal transmission without loss of the desired signal component at the same time.

A signal processing unit of the present invention includes: an input terminal to which an input signal is input; a first element for cutting off the DC component of the input signal;

an output terminal for outputting a signal output from the first element as an output signal; a determination element for determining whether or not the voltage of the output signal falls out of a predetermined detection threshold range; and, a switch for connecting the output node of the first element to a power supply circuit when the voltage of the output signal was determined to fall out of the detection threshold range at the determination element.

According to this configuration, even if the voltage of the output signal fell out of the detection threshold range due to dynamic variation in DC offset depending on the surrounding environment, the output node of the first element is connected to the power supply circuit, so that the current at the output node of the first element can be charged or discharged, whereby it is possible to cancel the DC offset that varies dynamically.

Further, since variation in the DC offset is directly monitored in accordance with whether or not the voltage of the output signal fell out of the detection threshold range, if there is no variation in the DC offset, no operation of canceling DC offset will be performed, hence no loss of the desired signal component will occur.

Accordingly, the signal processing unit of the present invention is able to achieve both countermeasures against the dynamic DC offset that varies dynamically and transmission without loss of the desired signal component at the same time.

BEST MODE FOR CARRYING OUT THE INVENTION

THE FIRST EMBODIMENT

Figure 10:
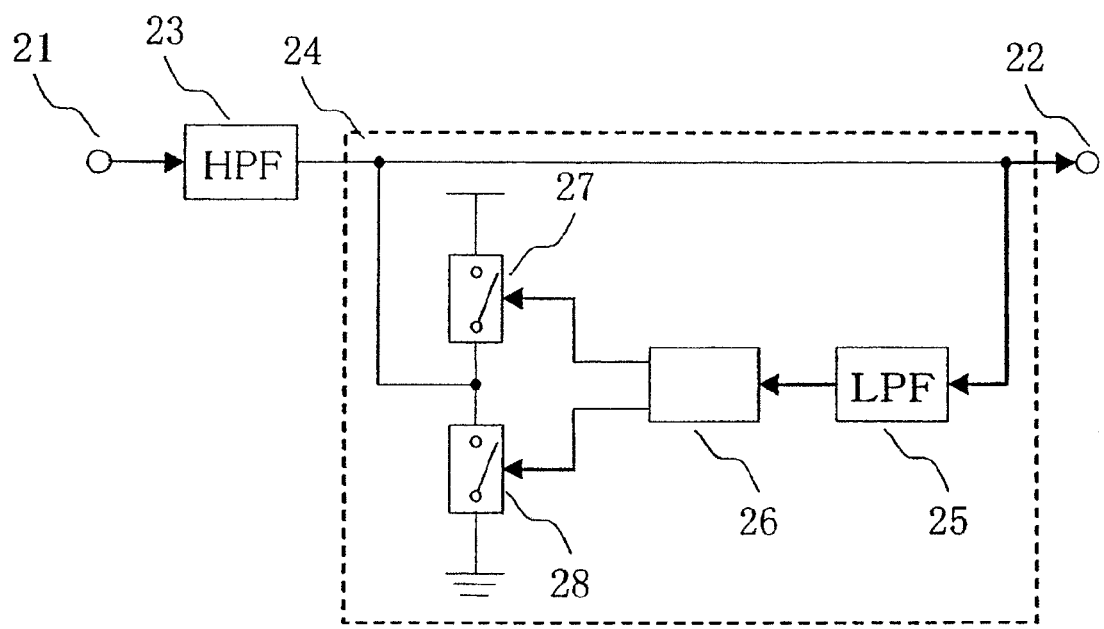
FIG. 10 is a diagram showing a configuration of a signal processing unit in accordance with the first embodiment of the present invention.

FIG. 10 shows a configuration of a signal processing unit according to the first embodiment of the present invention. The signal processing unit according to the present embodiment is comprised of input terminal 21, output terminal 22, HPF 23 as the first element and DC offset canceling loop 24.

DC offset canceling loop 24 is composed of LPF 25, determination element 26, first switch 27 and second switch 28.

Determination element 26 drives either first switch 27 or second switch 28 to connect the output node of HPF 23 to a power supply circuit when it has determined that the voltage of the output signal output from output terminal 22 fell out of the predetermined detection threshold range.

In the present embodiment, two power supply circuits are provided as the above power supply circuit, i.e., a first power supply circuit to be the power supply voltage of the signal processing circuit and a second power supply circuit to be the ground of the signal processing circuit. Accordingly, when determination element 26 determines that the voltage of the output signal has fallen out of the predetermined detection threshold range, it drives first switch 27 to connect the output node of HPF 23 to the power supply voltage or drives second switch 28 to connect the output node of HPF 23 to the ground.

The power supply voltage of the signal processing circuit, as the first power supply circuit, may be shared with the power supply voltage for driving the entire signal processing circuit. Further, the first power supply circuit may be constructed of a constant voltage source instead of a power supply voltage of the signal processing circuit.

Figure 11:
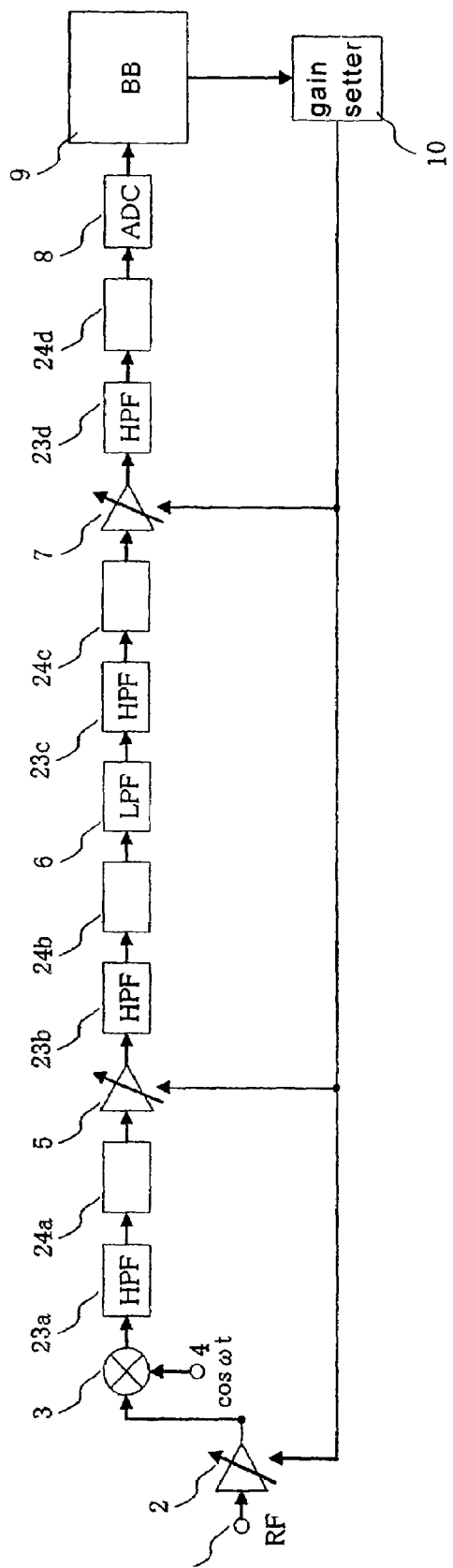
FIG. 11 is a diagram showing a configuration of specific example 1 of a direct conversion receiver using a signal processing unit according to the present invention.

The signal processing unit according to the present embodiment is applied to a direct conversion receiver as shown in FIG. 11, for example. Here, in FIG. 11, HPF 23 corresponds to HPFs 23a, 233, 23c and 23d while DC offset canceling loop 24 corresponds to DC offset canceling loops 24a, 24b, 24c and 24d. The details of FIG. 11 will be described later.

Next, a more specific configuration of DC offset canceling loop 24 shown in FIG. 10 will be described.

Specific Example 1 of DC Offset Cancelling Loop 24

Figure 12:
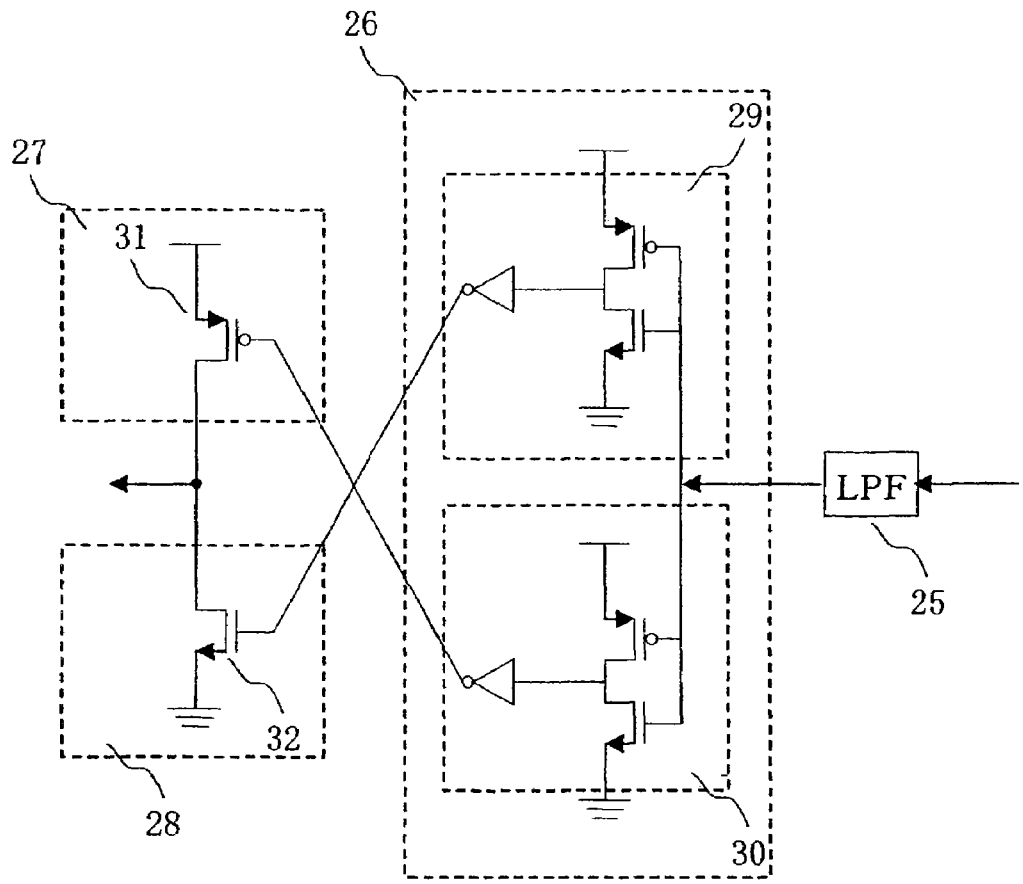
FIG. 12 is a diagram showing a configuration of specific example 1 of DC offset canceling loop 24 shown in FIG. 10.

FIG. 12 shows a configuration of specific example 1 of DC offset canceling loop 24 shown in FIG. 10. Determination element 26 is composed of first determination element 29 having a CMOS inverter coupled with an inverting amplifier and second determination element 30 having the same configuration as first determination element 29, the first and second determination elements being connected in parallel. First switch 27 and second switch 28 are p-type MOSFET 31 and n-type MOSFET 32, respectively. The gate terminal of p-type MOSFET 31 is connected to the output node of second determination element 30 while the gate terminal of n-type MOSFET 32 is connected to the output node of first determination element 29.

Here, in this specific example, the inverting amplifiers connected at the subsequent stages of CMOS inverters of first determination element 29 and second determination element 30 may be omitted, at the same time p-type MOSFET 31 of first switch 27 may be replaced by n-type MOSFET and n-type MOSFET 32 of second switch 28 may be replaced by p-type MOSFET.

Figure 13:
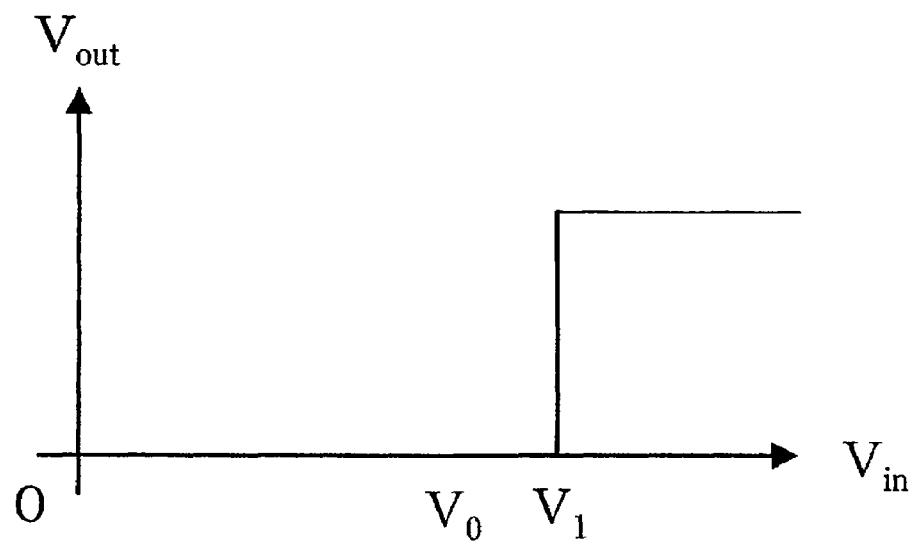
FIG. 13 is a diagram showing an input voltage-to-output voltage characteristic of first determination element 29 in DC offset canceling loop 24 shown in FIG. 12.
Figure 14:
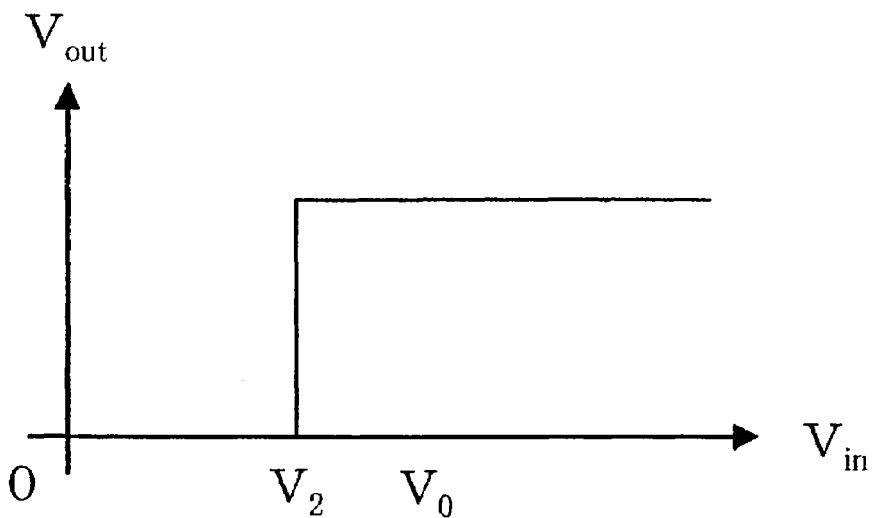
FIG. 14 is a diagram showing an input voltage-to-output voltage characteristic of second determination element 30 in DC offset canceling loop 24 shown in FIG. 12.

FIG. 13 and FIG. 14 show input voltage-to-output voltage characteristics of first determination element 29 and second determination element 30, respectively. V0 represents the DC potential of the signal input to determination element 26 and V0 is determined depending on the DC potential of the signal output from LPF 25. That is, V0 is determined by the DC potential of the signal output from HPF 23, the input bias of an element connected to output terminal 22, or the like. V1 and V2 respectively represent the thresholds, the upper limit and lower limit of the detection threshold range for detecting DC offset variation, and are set in first determination element 29 and second determination element 30. Further, thresholds V1 and V2 are each adjusted by modifying the current drive capability ratio between the n-type MOSFET and p-type MOSFET which constitute the CMOS inverters at the first stage of first determination element 29 or second determination element 30. Thresholds V1 and V2 are deigned so that V2<V0<V1. When the signal input to determination element 26 falls within the range from thresholds V1 to V2, first determination element 29 outputs the Low level and second determination element 30 outputs the High level, which bring switches 27 and 28 to the Off state. Accordingly, when the voltage of the signal input to determination element 26 falls within the range from V1 to V2, the signal output from HPF 23 is output, as is, as the output signal from output terminal 22.

Next, the operation of the signal processing unit according to the present embodiment will be described. Herein, it is assumed that DC offset canceling loop 24 has the configuration of specific example 1 shown in FIG. 12. It should be noted that thresholds V1 and V2 set in first determination element 29 and second determination element 30, respectively, take such values that, in steady state, the amplitude of the signal output from LPF 25 falls within the range from thresholds V1 to V2.

To start, the operation when in the steady state will be described.

Of the input signals from input terminal 21 shown in FIG. 10, the signal that passed through HPF 23 is output from output terminal 22 as the output signal. In the steady state, the DC potential of the output signal from output terminal 22 is determined by the DC potential of the signal output from HPF 23, the input bias to the device connected to output terminal 22, or the like. At this time, DC offset canceling loop 24 to the output node of HPF 23 from output terminal 22 does not function because first switch 27 and second switch 28 are both off. Herein, the cutoff frequency of HPF 23 is selected low enough to lose the desired signal component.

Figure 15:
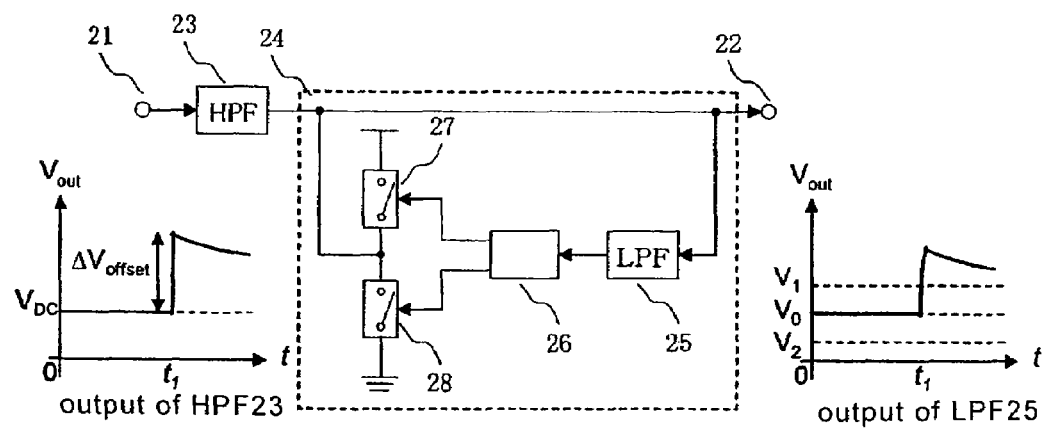
FIG. 15 is a diagram for illustrating the operation of the signal processing unit shown in FIG. 10.
Figure 16:
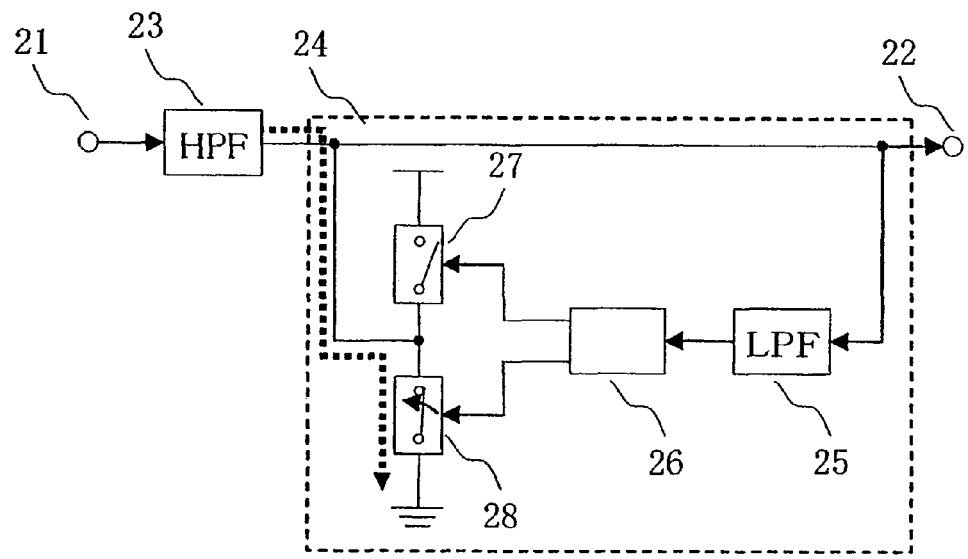
FIG. 16 is a diagram for illustrating the operation of the signal processing unit shown in FIG. 10.
Figure 17:
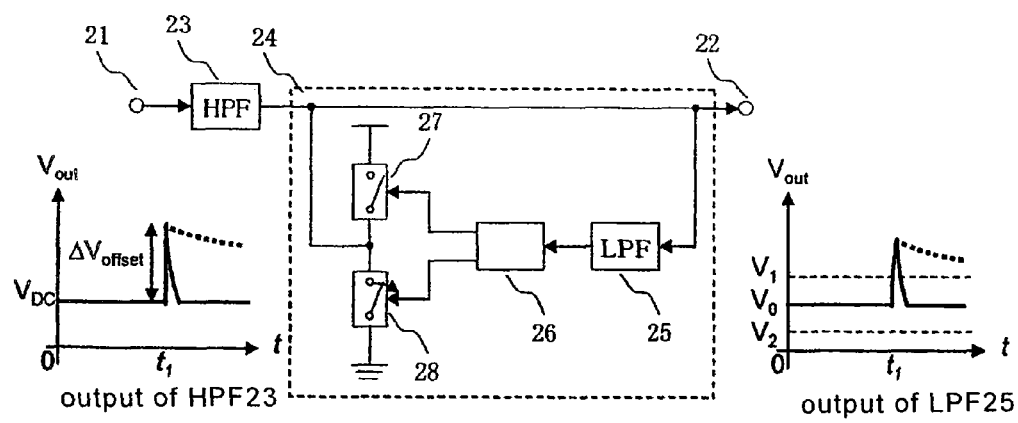
FIG. 17 is a diagram for illustrating the operation of the signal processing unit shown in FIG. 10.

Next, the operation when the amount of DC offset has changed stepwise at a point of time will be described. FIGS. 15 to 17 are diagrams for illustrating the operation of converging the DC level of the output signal from output terminal 22 when the input signal from input terminal 21 shown in FIG. 10 contains a positive DC offset.

HPF 23 is selected so that its cutoff frequency is low enough. Accordingly, if the amount of DC offset contained in the input signal changes stepwise, HPF 23 outputs the stepwise input signal approximately as it is to output terminal 22 (see the output waveform of HPF 23 on the left part in FIG. 15). Of the signals output from HPF 23, the low frequency component is picked up by LPF 25 and input to determination element 26 (see the output waveform of LPF 25 on the right part in FIG. 15). Determination element 26 determines that the time-dependent variation in DC offset is at a level which cannot be ignored when the signal component picked up by LPF 25 falls out of the range from thresholds V1 to V2.

Herein, at time t1, the DC offset contained in V0 varies to a positive DC offset exceeding threshold V1. In this case, first determination element 29 and second determination element 30 which constitute determination element 26, both output the High level so as to set the second switch 28 to the On state. As a result, the output node of HPF 23 is connected to the ground, so that current at the output node of HPF 23 is instantly discharged to the ground (see current indicated by the broken line in FIG. 16). Resultantly, the positive DC offset can be canceled. Afterwards, determination element 26 sets second switch 28 to the Off state when the DC offset comes to fall within the range from thresholds V1 to V2, and then the discharge is ended (see the output waveforms of HPF 23 and LPF 25 on the left and right in FIG. 17). Here, in the output waveforms of HPF 23 and LPF 25 on the left and right in FIG. 17, the waveforms indicated by broken lines are the ones when it is assumed that second switch 28 does not operate, and the waveforms indicated by solid lines are ones when second switch 28 is operated.

On the other hand, when the DC offset contained in V0 varies to a negative DC offset lower than threshold V2, first determination element 29 and second determination element 30 which constitute determination element 26, both output the Low level so as to set the first switch 27 to the On state. As a result, the output node of HPF 23 is connected to the power supply voltage, so that switch 27 is charged instantly by the current flowing from the output node of HPF 23, hence the negative DC offset can be cancelled.

If the time constant during the charging and discharging of current at the output node of HPF 23 is shorter than the time constant of HPF 23, the above charging and discharging operation can be done in a time much shorter than the time constant of HPF 23. Once the aforementioned charging and discharging operation is completed, the amplitude of the signal output from LPF 25 continues to fall within the range in which the operation of canceling DC offset by DC offset canceling loop 24 stops or within the range from thresholds V1 to V2 as long as no DC offset occurs again. That is, the steady state goes on.

At this time, LPF 25 adjusts the response time of DC offset canceling loop 24 and also plays a role of preventing malfunction that an instant increase in amplitude will cause.

First, the reason why the response time of DC offset canceling loop 24 is adjusted by LPF 25 will be described.

When the cutoff frequency of LPF 25 is high, the high frequency component which was varied by DC offset will be also transferred to the input node of determination element 26. Accordingly, at approximately the same time that the DC level of the signal output from the HPF 23 comes to fall within the range from thresholds V1 to V2, either first switch 27 or second switch 28 is set to the Off state, and the operation of canceling DC offset is ended. In other words, the cutoff frequency of LPF 25 is set up so that, at approximately the same time that the DC level of the signal output from the HPF 23 comes to fall within the range from thresholds V1 to V2, either first switch 27 or second switch 28 will be set to the Off state. Accordingly, DC offset of V1-V0 will remain for a positive DC offset, and DC offset of V2-V0 will remain for a negative DC offset.

Conversely, when the cutoff frequency of LPF 25 is low, the operation of canceling the DC offset does not terminate even after the DC level of the signal output from HPF 23 has fallen within the range from thresholds V1 to V2, hence the DC level will overshoot V0, which is the desired DC level.

In sum, it is possible to optimize the DC level of the signal output from HPF 23 by adjusting the response time of DC offset canceling loop 24 by means of LPF 25.

Next, the reason why malfunction due to an instant increase in amplitude can be prevented by LPF 25 will be described.

Herein, a case in which the signal processing unit according to the present embodiment is applied to a direct conversion receiver that is used for an OFDM system (Orthogonal Frequency Division Multiplexing System) will be considered. In the OFDM system, there are cases where the signal amplitude instantly becomes greater when different sub carriers become in phase with one another at a point of time. If this signal amplitude falls out of the range from threshold V1 to V2 of determination element 26, this causes circuit malfunction in the direct conversion receiver. In order to avoid this, in the present embodiment, LPF 25 is used to limit the frequency component of the signal to be input to determination element 26.

FIG. 11 shows an example in which the signal processing unit of the present embodiment is applied to a direct conversion receiver. In FIG. 11, only one of the two routes of the branch of the signal having been amplified by LNA 2 is shown.

Figure 6:
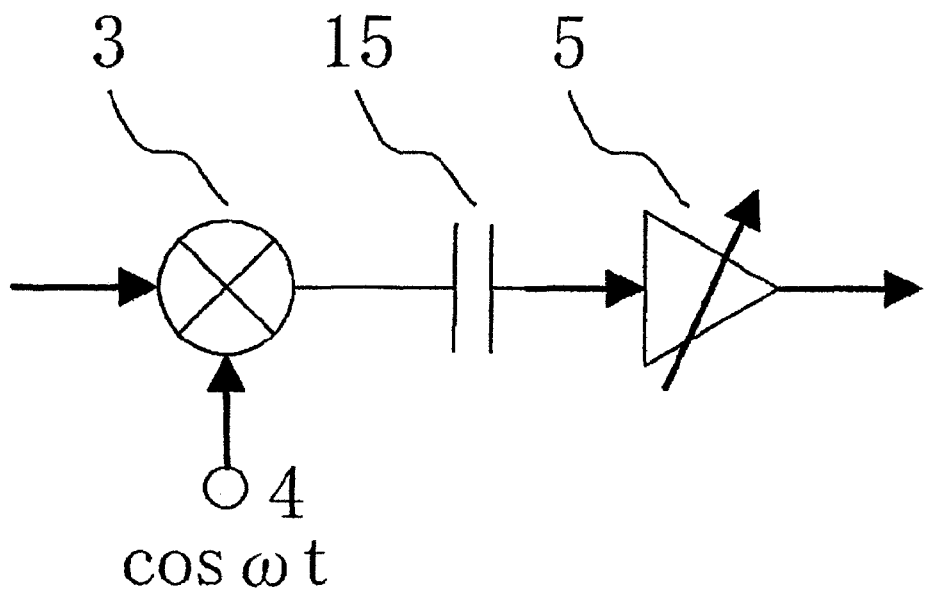
FIG. 6 is a diagram showing one configurational example of a conventional signal processing unit.
Figure 7:
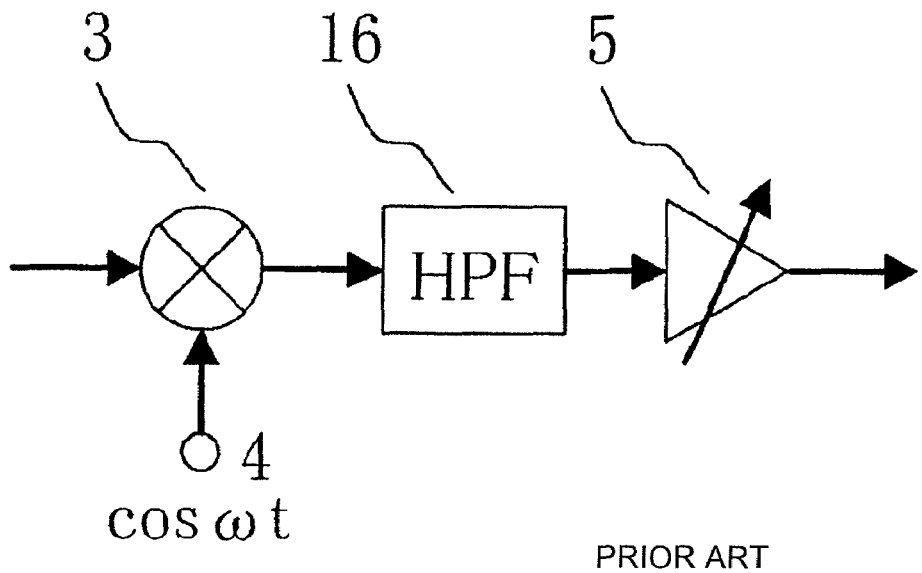
FIG. 7 is a diagram showing another configurational example of a conventional signal processing unit.
Figure 8:
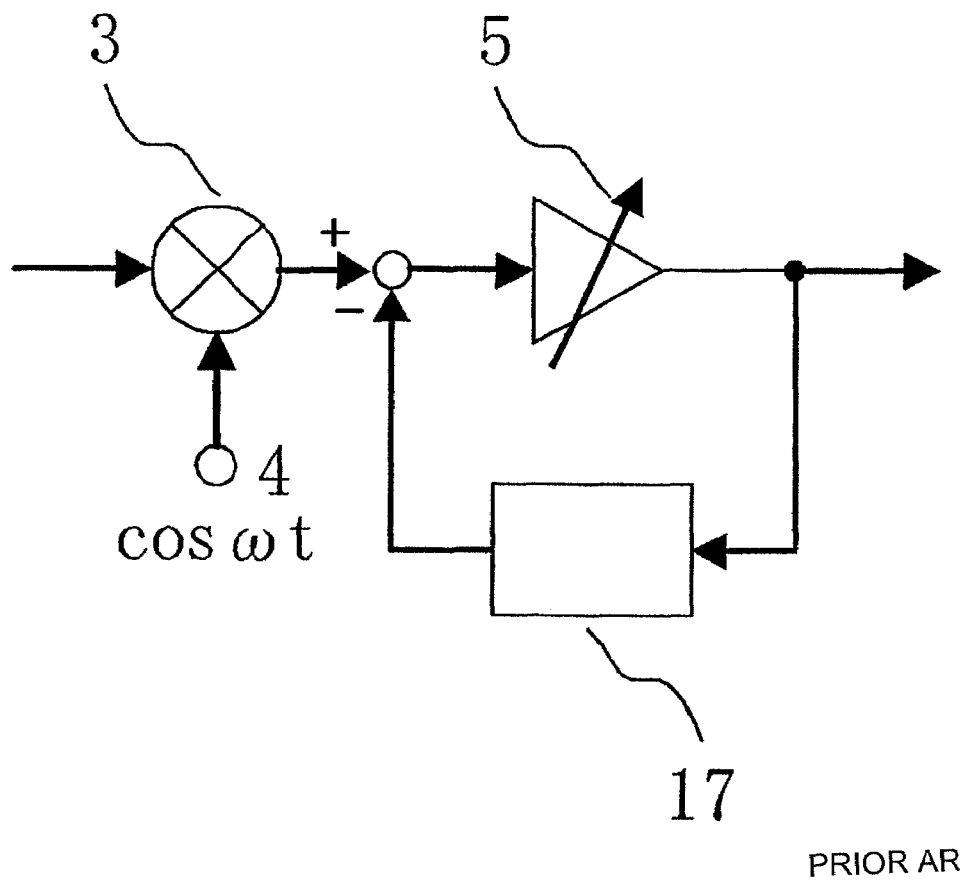
FIG. 8 is a diagram showing another configurational example of a conventional signal processing unit.
Figure 9:
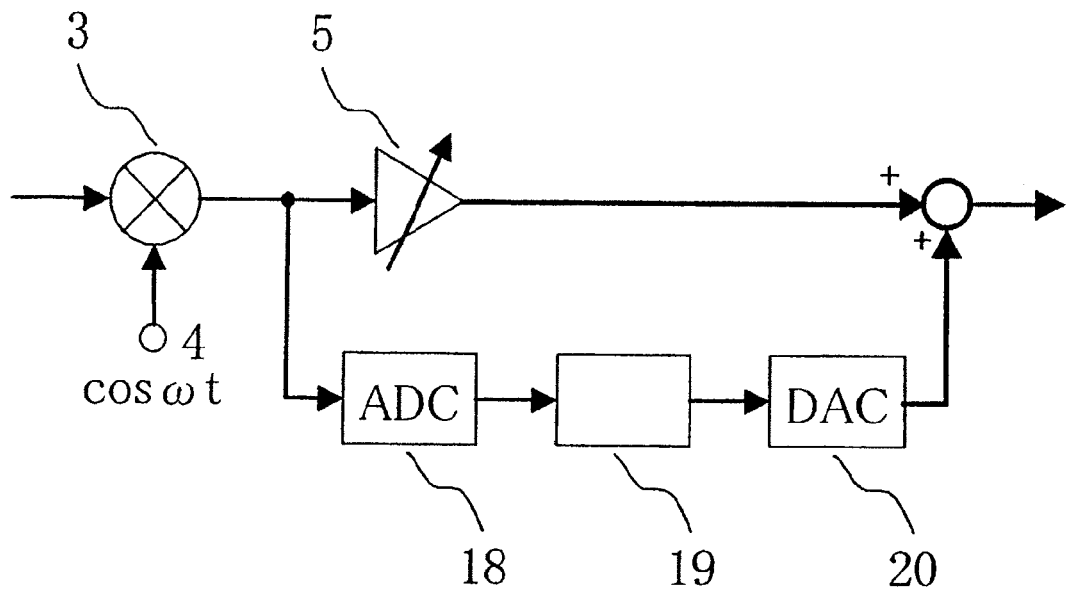
FIG. 9 is a diagram showing another configurational example of a conventional signal processing unit.

In contrast to the conventional art using a simple high-pass element, as shown in FIGS. 6 to 8, in which transmission without loss of the desired signal component and countermeasure against dynamic offset can not be achieved at the same time, the present embodiment has the advantage of realizing both. Further, as shown in FIG. 9, when compared to the conventional technique in which DC offset is taken in by ADC 18 and in which the amount of DC offset is detected by signal processor 19 so as to generate a signal canceling the DC offset by DAC 20, the embodiment is advantageous in view of the consideration that complex ADC and DAC are not required, that there is no need to supply of external control signals that are synchronous with time slots, and that DC offset variation in the desired reception time slot can be used.

Further, according to the present embodiment, variation in DC offset is directly monitored so as to perform an operation to cancel of the DC offset. In this respect, compared to the conventional art disclosed in patent document 1 in which variation of DC offset is indirectly observed, based on the received signal level, the embodiment has the advantage of performing a reliable operation to cancel the DC offset. That is, if the DC offset varies even without any variation in the received signal level, the operation of converting the DC level of the output signal from output terminal 22 is positively performed. At the same time, as long as the DC offset is unvaried even with a change in the received signal level, any extra operation which is likely to lose the desired signal component will be never performed. Further, since there is no need to provide a control device that detects variation of the received signal level and that generates a control signal to be output to the HPF, the hardware configuration is simple.

Further, according to the present embodiment, input terminal 21 and output terminal 22 are separated DC-wise from each other by HPF 23. Accordingly, the prior art problem that the DC level of the output signal from output terminal 22 cannot be made to converge at the same time that the time constant of HPF 23 is increased, disclosed in patent document 2, can be solved. That is, in the present embodiment, once current from the output node of HPF 23 is charged by first switch 27, no signal is transferred to determination element 26, so that the system reliably recovers its steady state.

Specific Example 2 of DC Offset Canceling Loop 24

Figure 18:
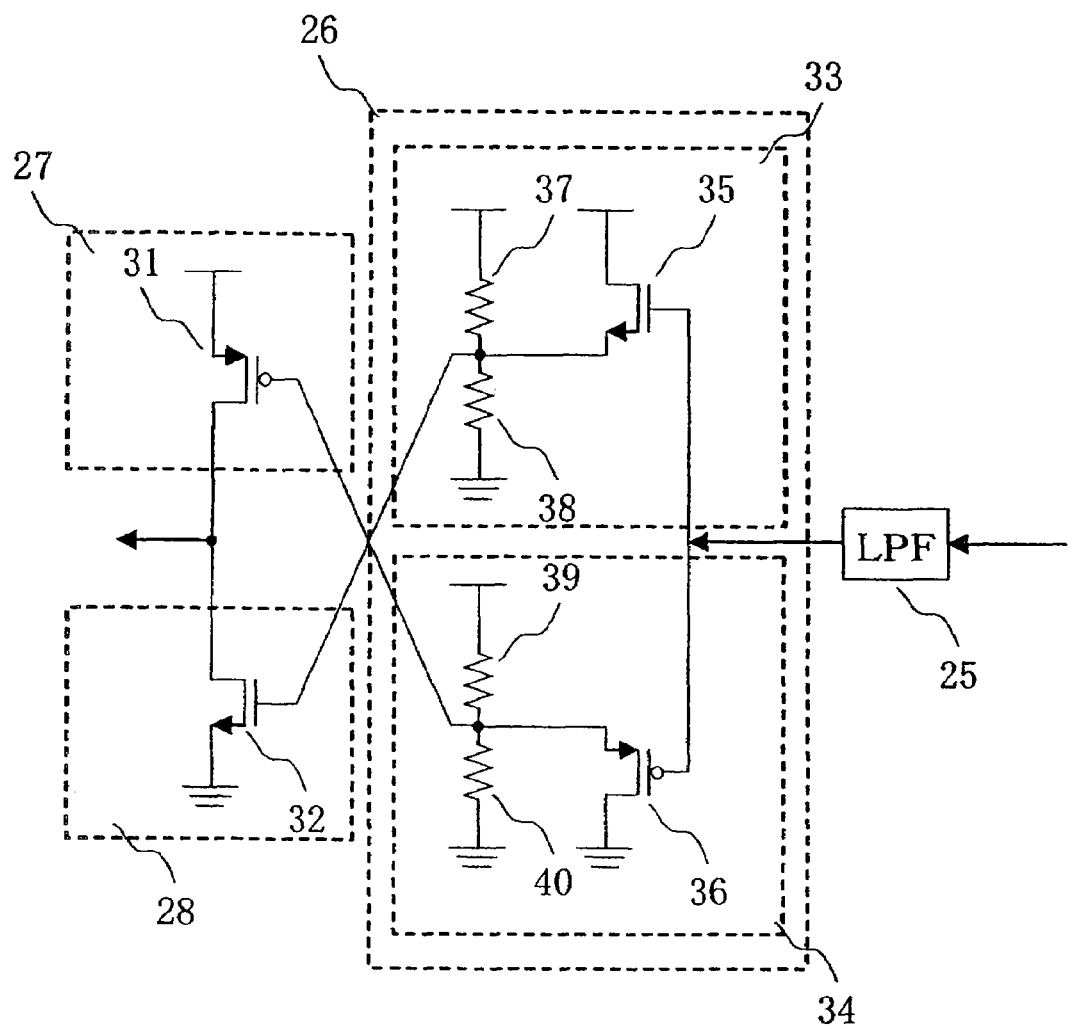
FIG. 18 is a diagram showing a configuration of specific example 2 of DC offset canceling loop 24 shown in FIG. 10.

FIG. 18 shows a configuration of specific example 2 of DC offset canceling loop 24 shown in FIG. 10. Determination element 26 is composed of first determination element 33 for detecting a positive DC offset contained in DC potential V0 of the signal input to determination element 26 and is composed of second determination element 34 for detecting a negative DC offset contained in DC potential V0. First determination element 33 is composed of n-type MOSFET 35 and resistors 37 and 38 connected in series between the power supply voltage and the ground of the signal processing unit. The source terminal of n-type MOSFET 35 is connected to the node of resistors 37 and 38, and the node forms the output node of first determination element 33. Second determination element 34 is composed of p-type MOSFET 36 and resistors 39 and 40 connected in series between the power supply voltage and the ground of the signal processing unit. The source terminal of p-type MOSFET 36 is connected to the node of resistors 39 and 40, and the node forms the output-node of second determination element 34. The input node of first determination element 33 and that of second determination element 34 are connected in parallel. Further, the output node of first determination element 33 is connected to the input node of second switch 28, and the output node of second determination element 34 is connected to the input node of first switch 27. Here, the configuration of first switch 27 and second switch 28 is the same as that in specific example 1 shown in FIG. 12.

Figure 19:
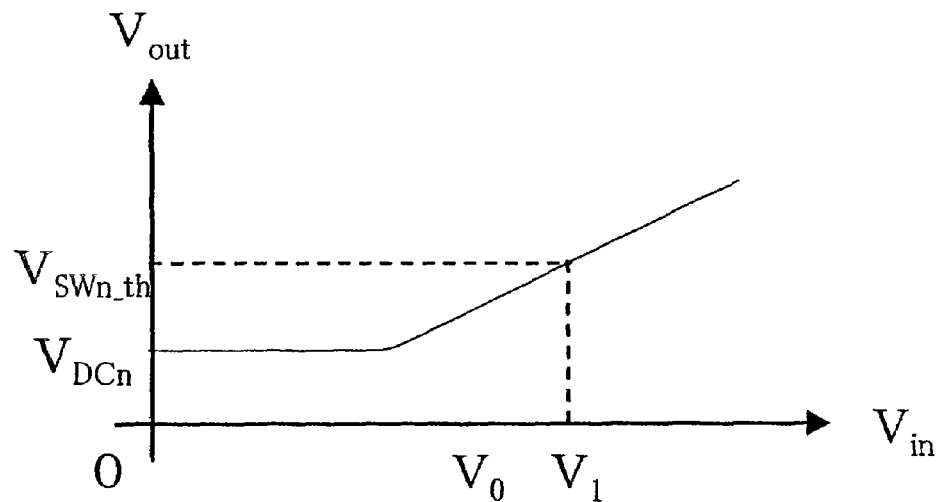
FIG. 19 is a diagram showing an input voltage-to-output voltage characteristic of first determination element 33 in DC offset canceling loop 24 shown in FIG. 18.
Figure 20:
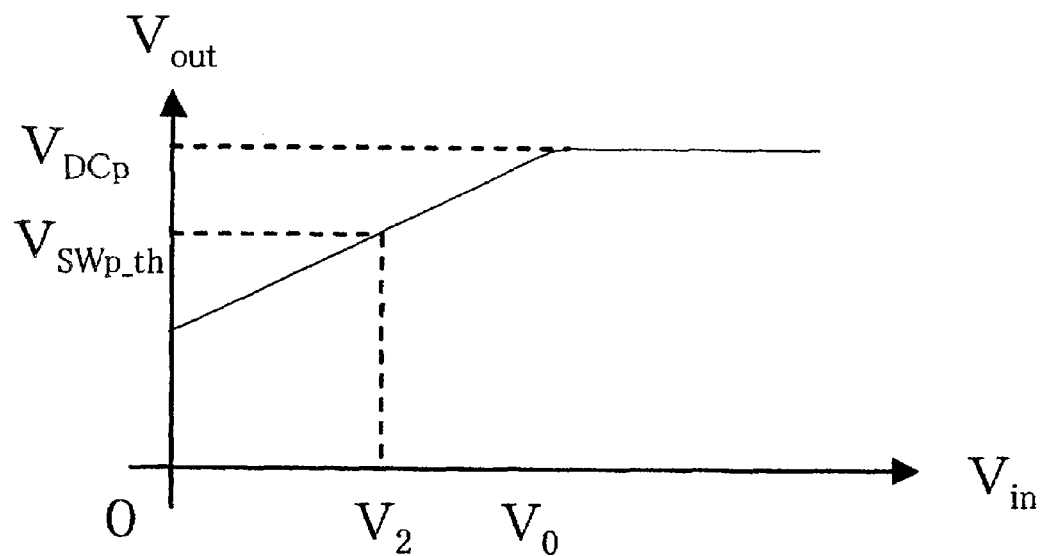
FIG. 20 is a diagram showing an input voltage-to-output voltage characteristic of second determination element 34 in DC offset canceling loop 24 shown in FIG. 18.

FIG. 19 and FIG. 20 show input voltage-to-output voltage characteristics of first determination element 33 and second determination element 34, respectively. V1 and V2 respectively represent the thresholds, the upper limit and lower limit of the detection threshold range for detecting the variation in DC offset, and are set in first determination element 33 and second determination element 34. Threshold V1 is adjusted by modifying the values of resistors 37 and 38 connected to the source terminal of n-type MOSFET 35. Threshold V1 is deigned such that when the DC potential of the signal input to first determination element 33 exceeds V1, the potential of the signal output from first determination element 33 will exceed threshold VSWn_th of n-type MOSFET 32 that constitutes second switch 28. On the other hand, threshold V2 is adjusted by modifying the values of resistors 39 and 40 connected to the source terminal of p-type MOSFET 36. Threshold V2 is deigned such that when the DC potential of the signal input to second determination element 34 is lower than V2, the potential of the signal output from second determination element 34 will be lower than threshold VSWp_th of p-type MOSFET 31 that constitutes first switch 27. VDCn represents the DC potential of first determination element 33 in the steady state free from DC offset, and is set at an appropriate value so that second switch 28 is brought to the Off state. VDCp represents the DC potential of second determination element 34 in the steady state free from DC offset, and is set at an appropriate value so that first switch 27 is brought to the Off state.

Specific Example 3 of DC Offset Canceling Loop 24

Figure 21:
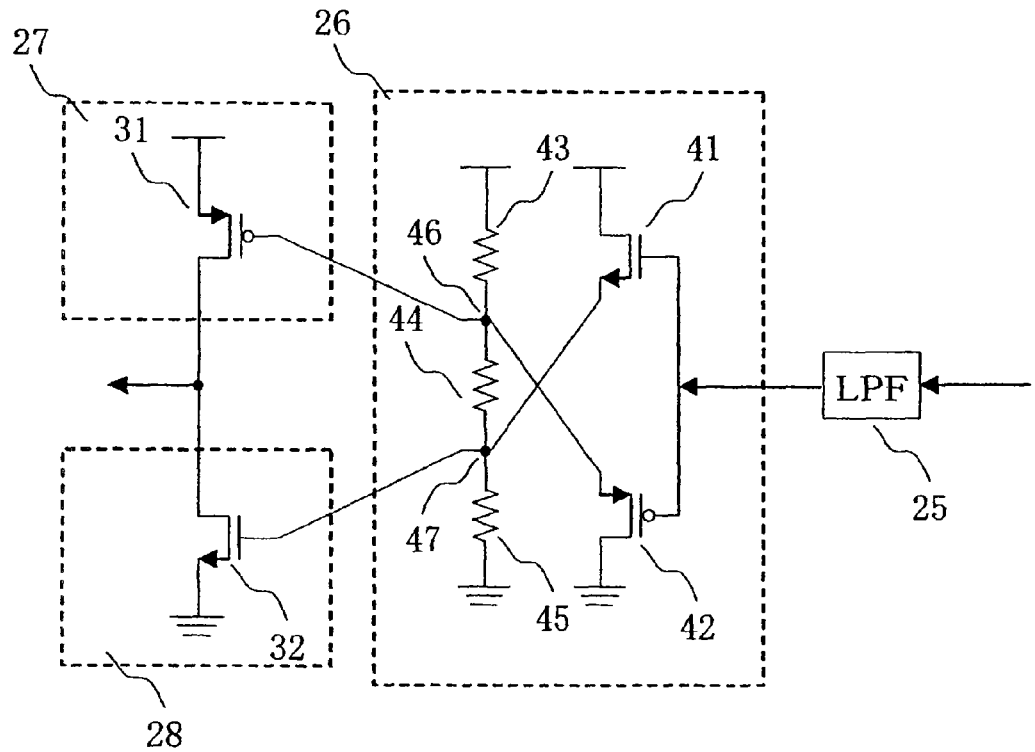
FIG. 21 is a diagram showing a configuration of specific example 3 of DC offset canceling loop 24 shown in FIG. 10.

FIG. 21 shows a configuration of specific example 3 of DC offset canceling loop 24 shown in FIG. 10. In determination element 26, the gate terminals of n-type MOSFET 41 and p-type MOSFET 42 are connected in parallel as the input terminal of determination element 26 so as to perform source-follower operation. Resistors 43, 44 and 45 are connected in series between the power supply voltage and the ground of the signal processing unit. The source terminal of p-type MOSFET 42 is connected to first node 46 of the junctions of resistors 43, 44 and 45 while the source terminal of n-type MOSFET 41 is connected to second node 47 of the junctions of resistors 43, 44 and 45, so that first node 46 and second node 47 constitute the output nodes of determination element 26. First node 46 is connected to the input node of first switch 27 and second node 47 is connected to the input node of second switch 28. Here, the configuration of first switch 27 and second switch 28 is the same as that in specific example 1 shown in FIG. 12.

Figure 22:
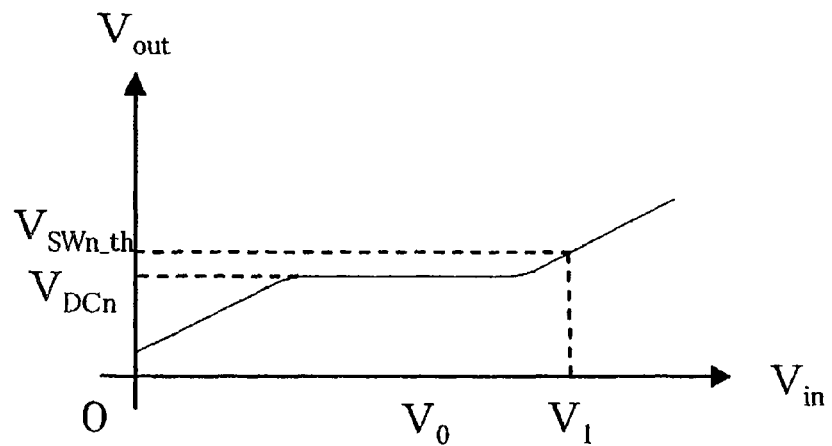
FIG. 22 is a diagram showing an input voltage-to-output voltage characteristic at node 47 in DC offset canceling loop 24 shown in FIG. 21.
Figure 23:
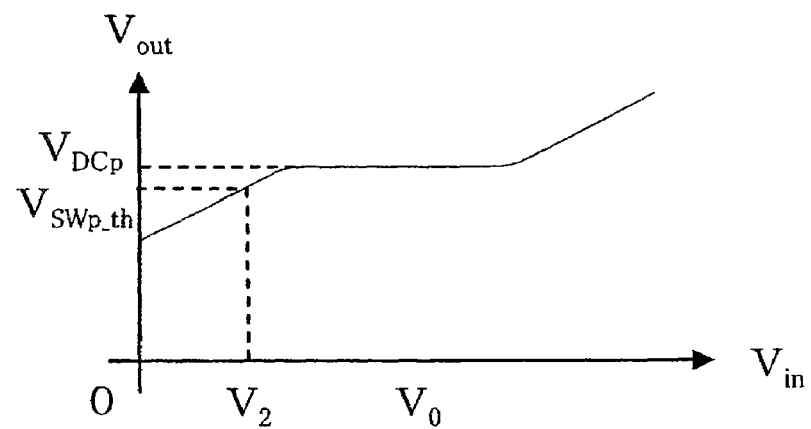
FIG. 23 is a diagram showing an input voltage-to-output voltage characteristic at node 46 in DC offset canceling loop 24 shown in FIG. 21.

FIG. 22 and FIG. 23 show input voltage-to-output voltage characteristics at node 47 and node 46, respectively. V1 and V2 respectively represent the thresholds, the upper limit and lower limit of the detection threshold range for detecting variation in DC offset, and are set in determination element 26. Thresholds V1 and V2 are adjusted by modifying the values of resistors 43, 44 and 45. Threshold V1 is deigned such that when the DC potential of the signal input to n-type MOSFET 41 is V1, the voltage at node 47 is VSWn_th. On the other hand, threshold V2 is designed such that when the DC potential of the signal input to p-type MOSFET 42 is V2, the voltage at node 46 is VSWp_th. VSWn_th is the threshold of n-type MOSFET 32 that constitutes second switch 28 while VSWp_th is the threshold of p-type MOSFET 31 that constitutes first switch 27. VDCn represents the DC potential at node 47 in the steady state free from DC offset, and is set at an appropriate value so that second switch 28 is brought to the Off state. On the other hand, VDCp represents the DC potential at node 46 in the steady state free from DC offset, and is set at an appropriate value so that first switch 27 is brought to the Off state.

THE SECOND EMBODIMENT

Figure 24:
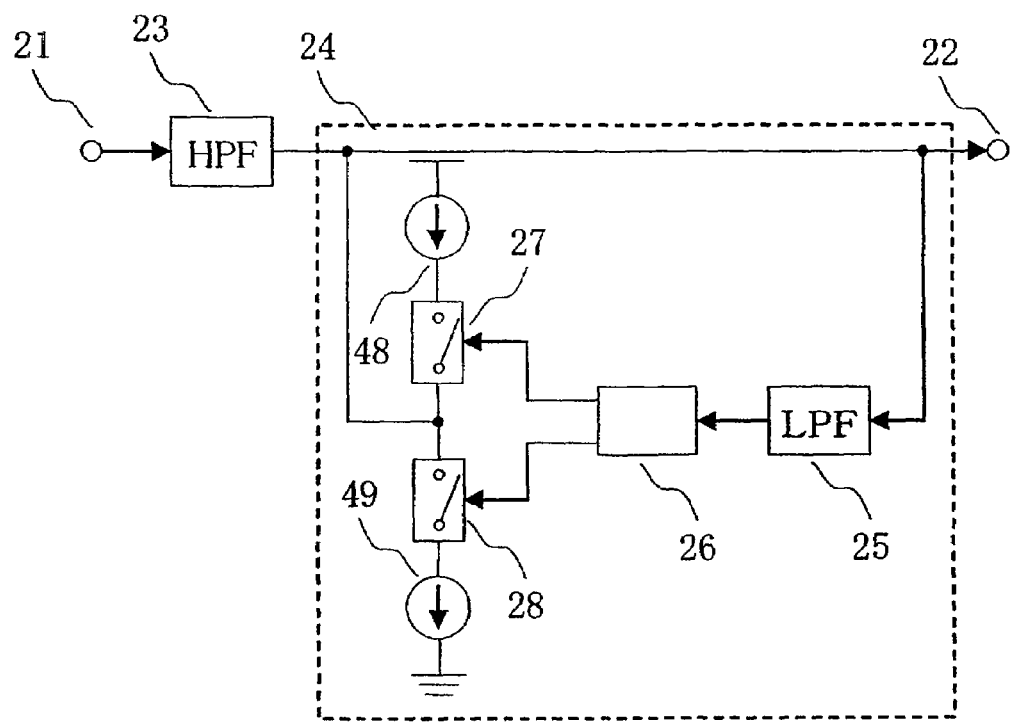
FIG. 24 is a diagram showing a configuration of a signal processing unit in accordance with the second embodiment of the present invention.

FIG. 24 shows a configuration of a signal processing unit according to the second embodiment of the present invention. When compared to the first embodiment shown in FIG. 10, the signal processing unit according to the present embodiment is different in that first switch 27 is connected to constant current source 48 from which current flows out into first switch 27, instead of to the power supply voltage of the signal processing unit, and is different in that second switch 28 is connected to constant current source 49 into which current flows from second switch 28, instead of to the ground of the signal processing unit.

In the present embodiment, if time variation in DC offset occurs, charging and discharging currents flow between the output node of HPF 23 and constant current sources 27 and 28, so that it is possible to obtain the effect which is one objective of the present invention.

THE THIRD EMBODIMENT

Figure 25:
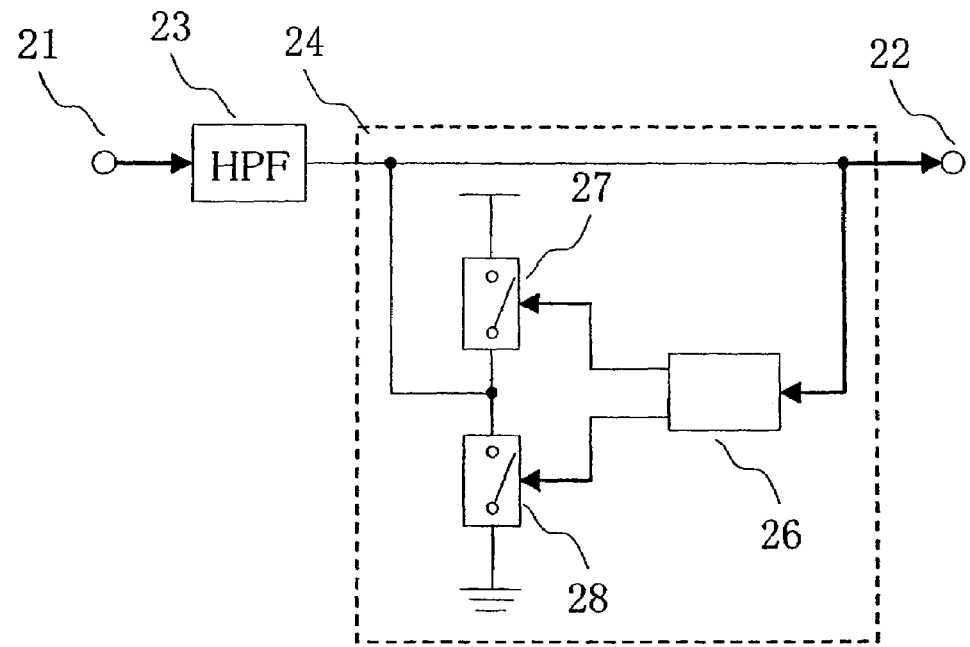
FIG. 25 is a diagram showing a configuration of a signal processing unit in accordance with the third embodiment of the present invention.

FIG. 25 shows a configuration of a signal processing unit according to the third embodiment of the present invention.

When compared to the first embodiment shown in FIG. 10, the signal processing unit according to the present embodiment is different in that LPF 25 is omitted.

According to the present invention, since LPF 25 is omitted, the signal output from HPF 23 is totally transferred to determination element 26. However, if, even with LPF 25 omitted, the high frequency component contained in the signal output from HPF 23 is suppressed to a certain degree through the circuits and the like in the previous stage of input terminal 21, the response time of DC offset canceling loop 24 becomes to an optimal value, so that it is possible to obtain the effect which is one objective of the present invention. Similarly, even with LPF 25 omitted, depending on the high frequency characteristics of HPF 23 and the time constant of the expected DC offset, the response time of DC offset canceling loop 24 takes an optimal value, so that it is possible to attain the effect which is one objective of the present invention. Further, though LPF 25 is omitted in the signal processing unit according to the present embodiment, it is possible to apply it to a communications system in which instantaneous increase in amplitude does not occur.

THE FOURTH EMBODIMENT

Figure 26:
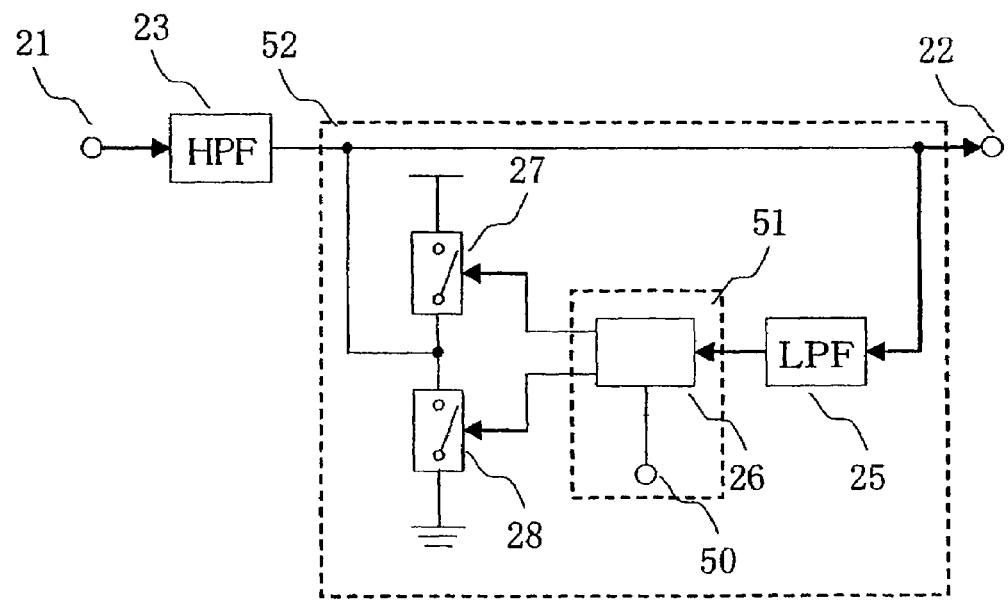
FIG. 26 is a diagram showing a configuration of a signal processing unit in accordance with the fourth embodiment of the present invention.

FIG. 26 shows a configuration of a signal processing unit according to the fourth embodiment of the present invention. When compared to the first embodiment shown in FIG. 10, the signal processing unit according to the present embodiment is different in that DC offset canceling loop 24 is replaced by DC offset canceling loop 52 that has a threshold adjustment function. Detailedly, when compared to DC offset canceling loop 24, DC offset canceling loop 52 is different in that control terminal 50, that outputs a signal for adjustment of the thresholds to be the upper limit and lower limit of the detection threshold range set in determination element 26, is provided. Herein, the configuration consisting of determination element 26, and control terminal 50 is called determination element 51.

According to the present embodiment, even when the amplitude of the desired signal component contained in the input signal has been varied due to gain switching or the like in the circuit prior to input terminal 21 so that the amplitude of the signal to be input to determination element 26 has become too small or too large in the steady state, it is possible to deal correctly with DC offset variation without causing DC offset canceling loop 52 to operate and to erroneously cancel the desired signal component of the output signal. It is apparent that other basic functions are the same as those in the first embodiment shown in FIG. 10.

Here, in the present embodiment, control terminal 50 may be used as a terminal that outputs a signal for stopping the detecting operation of DC offset variation. Further, two control terminals equivalent to control terminal 50 may be provided so that one of the control terminals is used for threshold adjustment of determination element 26, and the other control terminal may be used to stop the detection operation of DC offset variation.

Next, a more specified configuration of DC offset canceling loop 52 shown in FIG. 26 will be described.

Specific Example 1 of DC Offset Canceling Loop 52

Figure 27:
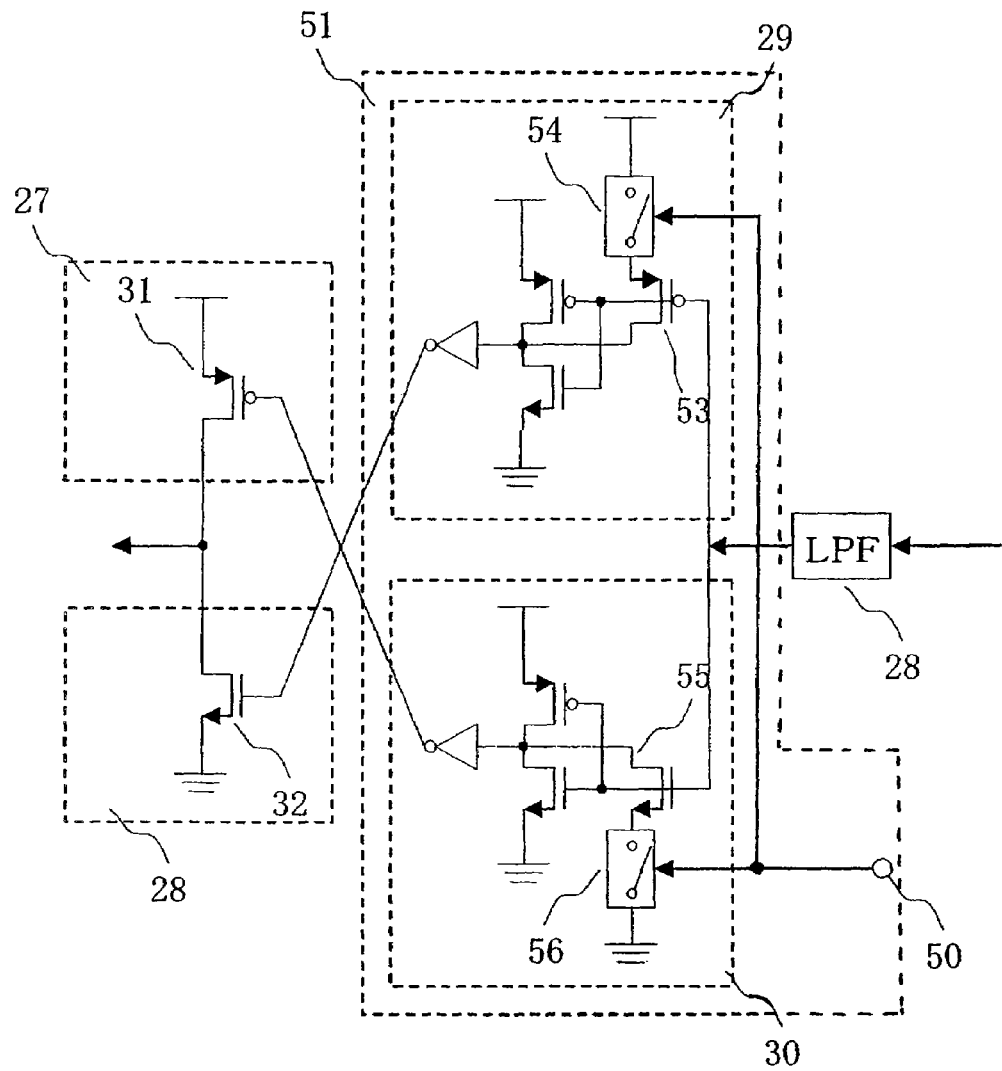
FIG. 27 is a diagram showing a configuration of specific example 1 of DC offset canceling loop 52 shown in FIG. 26.

FIG. 27 shows a configuration of specific example 1 of DC offset canceling loop 52 shown in FIG. 26. DC offset canceling loop 52 according to this specific example is different, when compared to DC offset canceling loop 24 shown in FIG. 12, in that in first determination element 29, p-type MOSFET 53 is connected in parallel with the p-type MOSFET that constitutes the first stage CMOS inverter, the source terminal of p-type MOSFET 53 is connected to the power supply voltage by way of switch 54, and is different in that in second determination element 30, n-type MOSFET 55 is connected in parallel with the n-type MOSFET that constitutes the first stage CMOS inverter, and the source terminal of n-type MOSFET 55 is connected to the ground by way of switch 56, and is different in that the on/off control of switches 54 and 56 is carried out based on the signal from control terminal 50.

Figure 28:
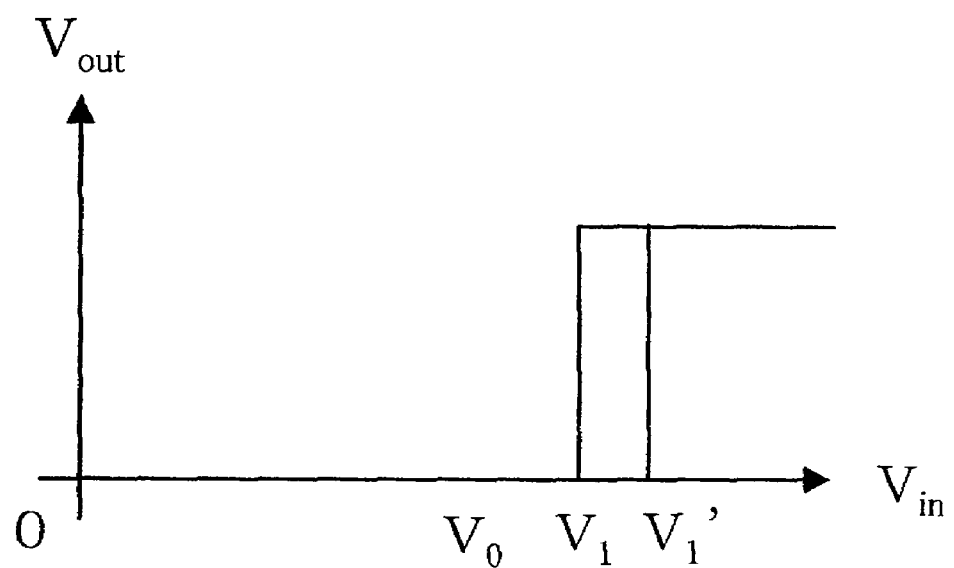
FIG. 28 is a diagram showing an input voltage-to-output voltage characteristic of first determination element 29 in DC offset canceling loop 52 shown in FIG. 27.
Figure 29:
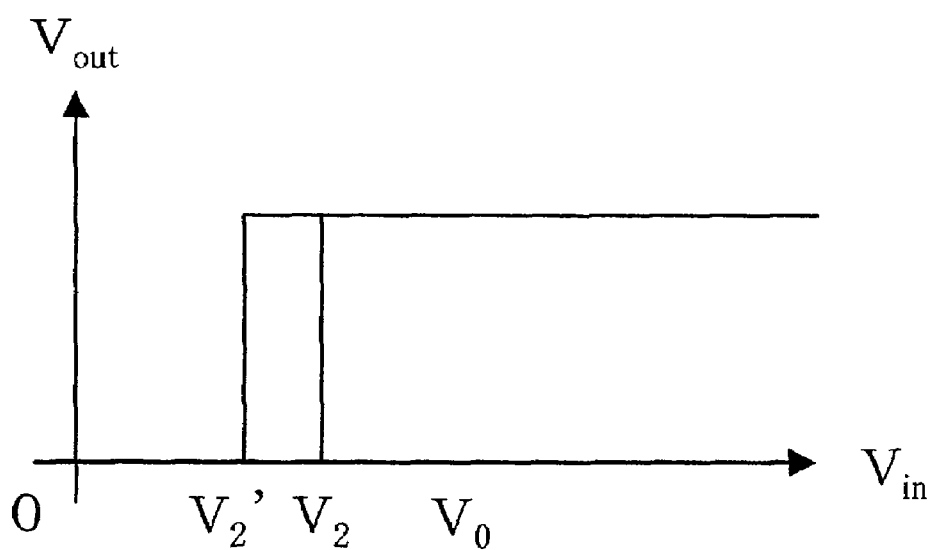
FIG. 29 is a diagram showing an input voltage-to-output voltage characteristic of second determination element 30 in DC offset canceling loop 52 shown in FIG. 27.

According to the present specific example, it is possible to modify the current drive capability ratio between p-type MOSFET 53 that constitutes the first stage CMOS inverter of first determination element 29 and n-type MOSFET 55 that constitutes the first stage CMOS inverter of second determination element 30, by turning switches 54 and 56 on or off. Accordingly, it is possible to change the logical thresholds of the CMOS inverters. As a result, as shown in the input voltage-to-output voltage characteristic of first determination element 29 in FIG. 28, the threshold set in first determination element 29 can be adjusted to V1, V1' etc. Similarly, as shown in the input voltage-to-output voltage characteristic of second determination element 30 in FIG. 29, the threshold set in second determination element 30 can be adjusted to V2, V2' etc.

Further, according to the present specific example, in first determination element 29 and second determination element 30, n-type MOSFET 53 and p-type MOSFET 56 are connected to the power supply voltage and the ground by way of switches 54 and 56, respectively, and the on/off control of switches 54 and 56 is performed based on the signal from control terminal 50. This makes it possible to stop the operation of detecting DC offset variation.

Specific Example 2 of DC Offset Canceling Loop 52

Figure 30:
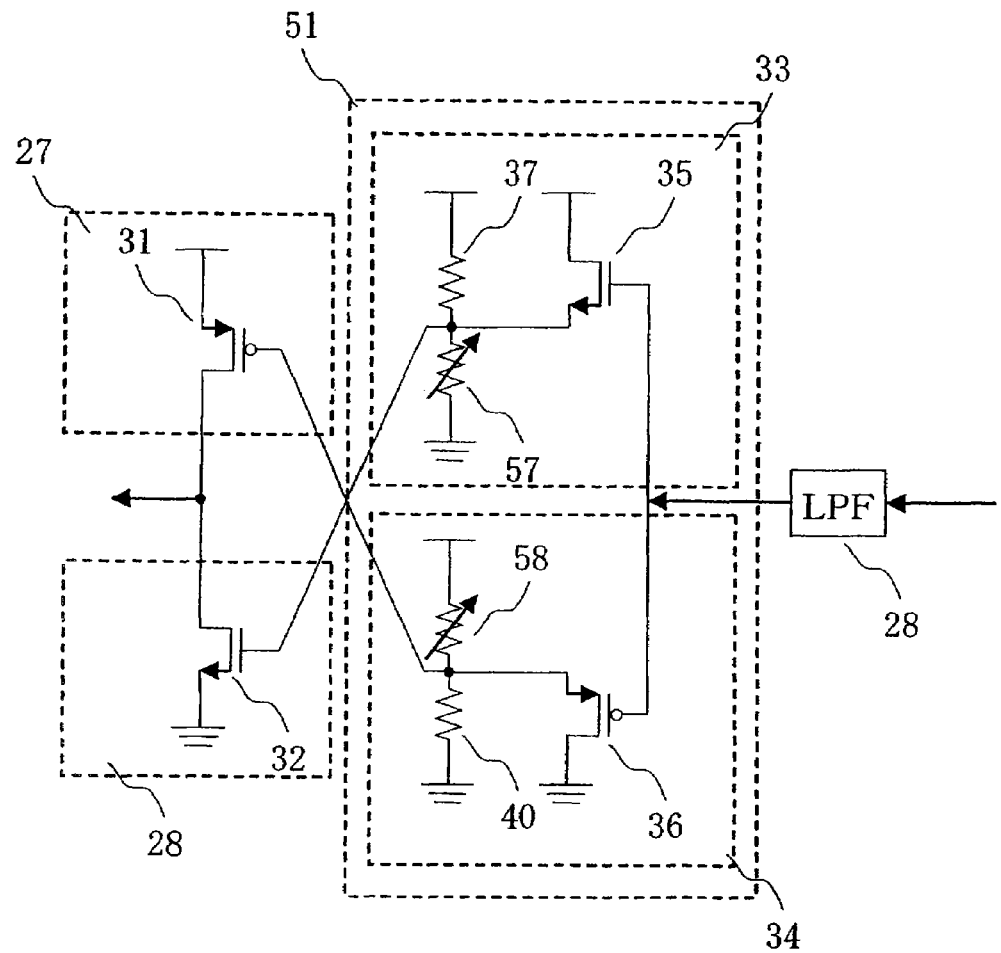
FIG. 30 is a diagram showing a configuration of specific example 2 of DC offset canceling loop 52 shown in FIG. 26.

FIG. 30 shows a configuration of specific example 2 of DC offset canceling loop 52 shown in FIG. 26. DC offset canceling loop 52 according to this specific example is different, when compared to DC offset canceling loop 24 shown in FIG. 18, in that in first determination element 33, resistor 38 is replaced by variable resistor 57, in that in second determination element 34 resistor 39 is replaced by variable resistor 58 and in that the resistance of variable resistors 57 and 58 is controlled with the signal from control terminal 50 (not shown in FIG. 30).

Figure 31:
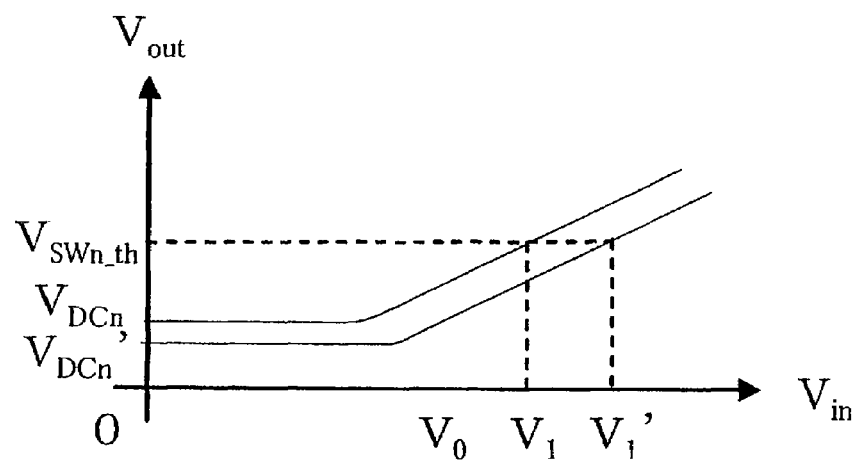
FIG. 31 is a diagram showing an input voltage-to-output voltage characteristic of first determination element 33 in DC offset canceling loop 52 shown in FIG. 30.
Figure 32:
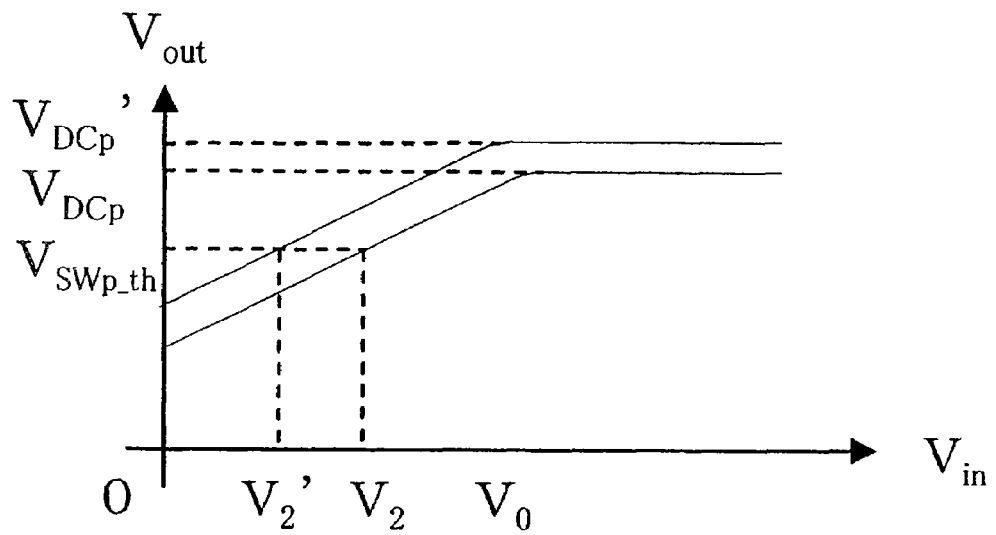
FIG. 32 is a diagram showing an input voltage-to-output voltage characteristic of second determination element 34 in DC offset canceling loop 52 shown in FIG. 30.

According to the present specific example, the resistance of variable resistors 57 and 58 is controlled with the signal from control terminal 50. As a result, the threshold set in first determination element 33 can be adjusted to V1, V1' etc., for VSWn_th, as shown in the input voltage-to-output voltage characteristic of first determination element 33 in FIG. 31. Similarly, the threshold set in second determination element 34 can be adjusted to V2, V2' etc., for VSWp_th, as shown in the input voltage-to-output voltage characteristic of second determination element 34 in FIG. 32.

Here, in the present specific example, resistors 38 and 39 shown in FIG. 18 are replaced by variable resistors 57 and 58, but the configuration is not limited to this. For example, it is possible to provide a configuration in which a line circuit having a switch as shown in FIG. 27 and a resistor connected in series is connected in parallel with resistor 38 and connected to the ground, while a line circuit having a switch as shown in FIG. 27 and a resistor connected in series is connected in parallel with resistor 39 and connected to the power supply voltage, and the switches can be on/off controlled based on the signal from control terminal 50. Also in this configuration, it is possible to adjust the thresholds set in first determination element 33 and second determination element 34.

Also, in the present specific example, it is possible to provide a configuration in which resistor 37 is connected to the power supply voltage by way of a switch as shown in FIG. 27, and resistor 40 is connected to the ground by way of a switch as shown in FIG. 27, and the switches can be on/off controlled based on the signal from control terminal 50. Also in this configuration, it is possible to stop the operation of detecting DC offset variation.

Specific Example 3 of DC Offset Canceling Loop 52

Figure 33:
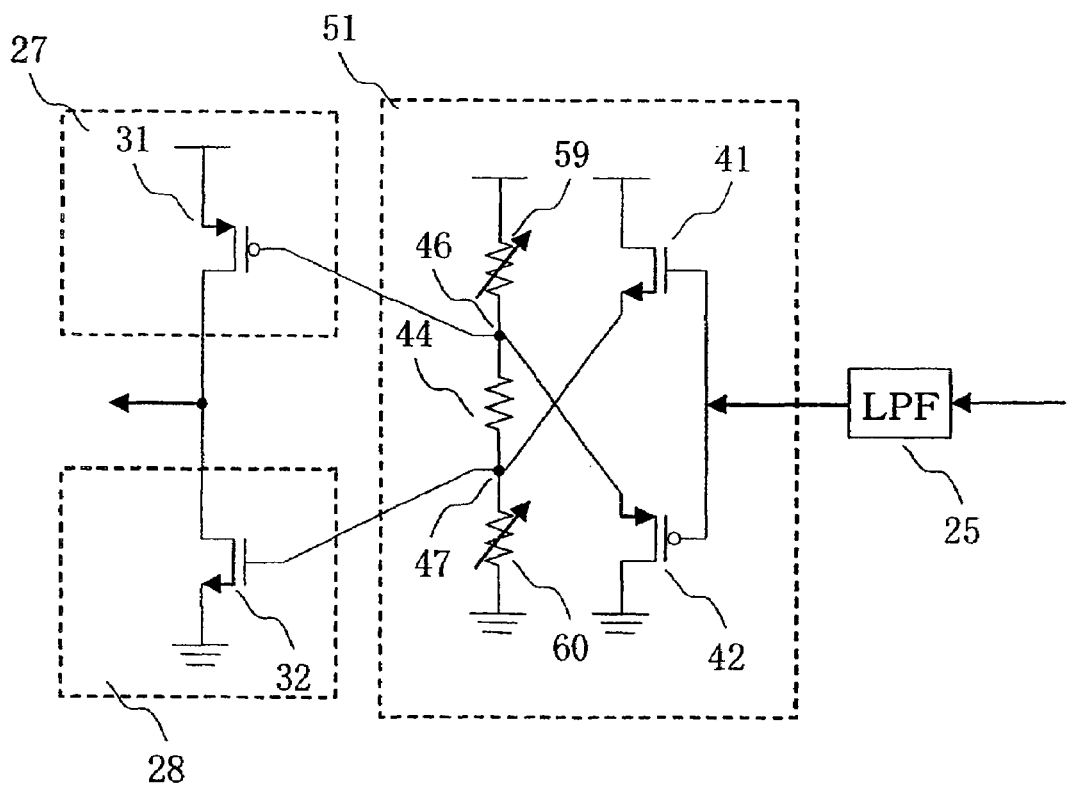
FIG. 33 is a diagram showing a configuration of specific example 3 of DC offset canceling loop 52 shown in FIG. 26.

FIG. 33 shows a configuration of specific example 3 of DC offset canceling loop 52 shown in FIG. 26. DC offset canceling loop 52 according to this specific example is different, when compared to DC offset canceling loop 24 shown in FIG. 21, in that resistors 43 and 45 are replaced by variable resistors 59 and 60 and in that the resistance of variable resistors 59 and 60 is controlled based on the signal from control terminal 50 (not shown in FIG. 33).

Figure 34:
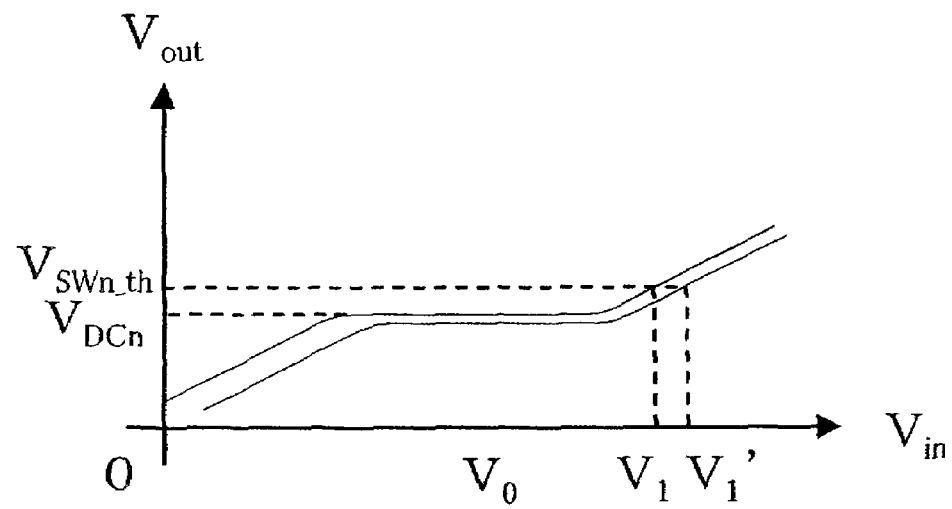
FIG. 34 is a diagram showing an input voltage-to-output voltage characteristic at node 47 in DC offset canceling loop 52 shown in FIG. 33.
Figure 35:
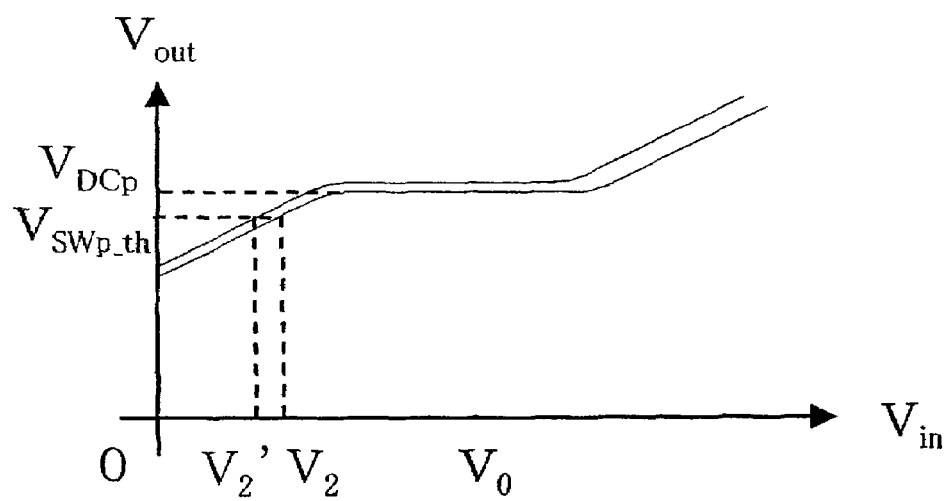
FIG. 35 is a diagram showing an input voltage-to-output voltage characteristic at node 46 in DC offset canceling loop 52 shown in FIG. 33.

As a result, according to the specific example, the threshold can be adjusted to V1, V1' etc., as shown in the input voltage-to-output voltage characteristic at node 47 of FIG. 34, and the threshold can be adjusted to V2, V2' etc., as shown in the input voltage-to-output voltage characteristic at node 46 of FIG. 35.

Here, in the present specific example, resistors 43 and 45 shown in FIG. 21 are replaced by variable resistors 59 and 60, but the configuration is not limited to this.

For example, it is possible to provide a configuration in which a line circuit having a switch as shown in FIG. 27 and a resistor connected in series is connected in parallel with resistor 43 and connected to the power supply voltage while a line circuit having a switch as shown in FIG. 27 and a resistor connected in series is connected in parallel with resistor 45 and connected to the ground, and the switches can be on/off controlled based on the signal from control terminal 50. Also in this configuration, it is possible to adjust the threshold set in first determination element 51.

Also, it is possible to provide a configuration in which resistor 43 and 45 shown in FIG. 21 is replaced by the switches as shown in FIG. 27 instead of by variable resistors 59 and 60, and nodes 46 and 47 are connected to the power supply voltage and the ground, respectively, by way of the switches to thereby perform on/off control of the switches in accordance with the signal from control terminal 50. Also in the configuration, it is possible to stop the operation of detecting DC offset variation.

THE FIFTH EMBODIMENT

Figure 36:
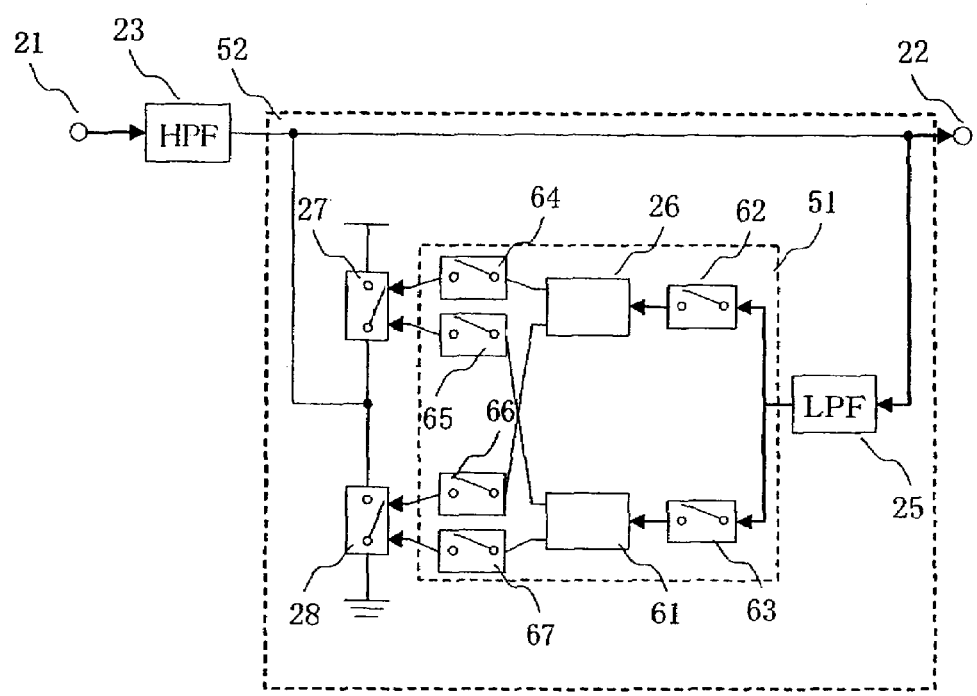
FIG. 36 is a diagram showing a configuration of a signal processing unit in accordance with the fifth embodiment of the present invention.

FIG. 36 shows a configuration of a signal processing unit according to the fifth embodiment of the present invention. When compared to the first embodiment shown in FIG. 10, the signal processing unit according to the present embodiment is different in that DC offset canceling loop 24 is replaced by DC offset canceling loop 52 having a threshold adjustment function. Detailedly, when compared to DC offset canceling loop 24, DC offset canceling loop 52 is different in that determination element 61, that is connected in parallel with determination element 26 and has a detection threshold range different from determination element 26, is added, in that switches 62 and 63 as switching means are added between the output node of LPF 25, in that the input nodes of determination elements 26 and 61 are added, and in that switches 64 to 67 as switching means are added between the output nodes of determination elements 26 and 61 and the input nodes of first switch 27 and second switch 28. Two or more determination elements can be connected in parallel. Herein, the arrangement made up of determination elements 26 and 61 and switches 62 to 67 is called determination element 51.

According to the present embodiment, even when the amplitude of the desired signal component contained in the input signal has been varied due to gain switching or the like in the circuit prior to input terminal 21 so that the amplitude of the signal to be input to determination element 26 has become too small or too large in the steady state, another determination element (61 or others) having suitable thresholds is selected and switching to the selected determination element is performed by switches 62 to 67, whereby it is possible to deal correctly with DC offset variation without causing the DC offset canceling loop 52 to operate and to erroneously cancel the desired signal component of the output signal. It is apparent that other basic functions are the same as those in the first embodiment shown in FIG. 10.

THE SIXTH EMBODIMENT

Figure 37:
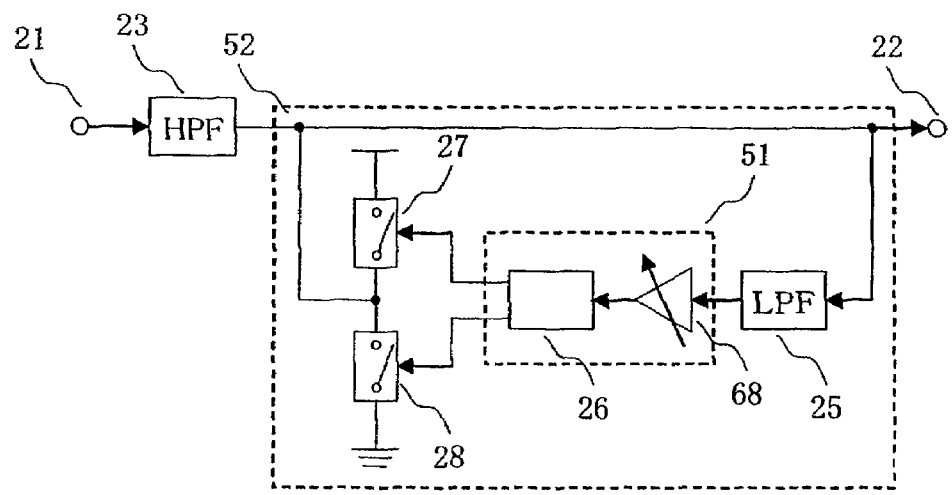
FIG. 37 is a diagram showing a configuration of a signal processing unit in accordance with the sixth embodiment of the present invention.

FIG. 37 shows a configuration of a signal processing unit according to the sixth embodiment of the present invention. When compared to the first embodiment shown in FIG. 10, the signal processing unit according to the present embodiment is different in that DC offset canceling loop 24 is replaced by DC offset canceling loop 52 having a threshold adjustment function. Detailedly, when compared to DC offset canceling loop 24, DC offset canceling loop 52 is different in that variable-gain amplifier 68 as a third element is added between LPF 25 and the input node of determination element 26. Herein, the arrangement made up of determination element 26 and variable-gain amplifier 68 is called determination element 51.

According to the present embodiment, even when the amplitude of the desired signal component contained in the input signal has been varied due to gain switching or the like in the circuit prior to input terminal 21, it is possible to prevent the amplitude of the signal that is to be input to determination element 26 from becoming too small or too large in the steady state, by adjusting the gain of variable-gain amplifier 68. As a result, it is possible to deal correctly with DC offset variation by a single determination element without causing the DC offset canceling loop 52 to operate and to erroneously cancel the desired signal component of the output signal. It is apparent that other basic functions are the same as those in the first embodiment shown in FIG. 10.

THE SEVENTH EMBODIMENT

Figure 38:
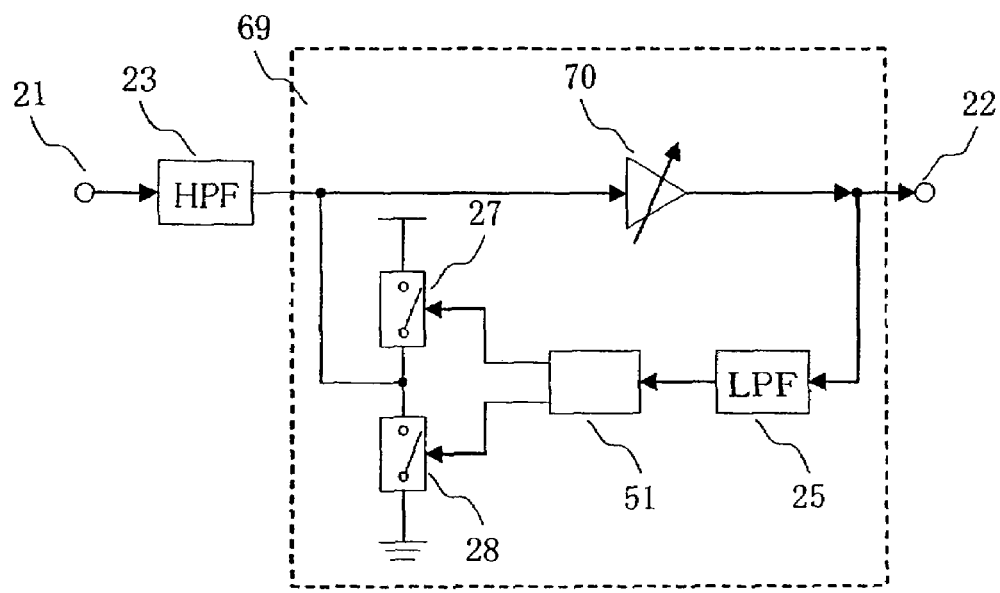
FIG. 38 is a diagram showing a configuration of a signal processing unit in accordance with the seventh embodiment of the present invention.

FIG. 38 shows a configuration of a signal processing unit according to the seventh embodiment of the present invention. When compared to the first embodiment shown in FIG. 10, the signal processing unit according to the present embodiment is different in that DC offset canceling loop 24 is replaced by DC offset canceling loop 69 having a threshold adjustment function. Detailedly, when compared to DC offset canceling loop 24, DC offset canceling loop 69 is different in that variable-gain amplifier 70 as a second element is added between the output node of HPF 23 and output terminal 22 and in that determination element 51 having a threshold adjustment function described in fourth to sixth embodiments (FIGS. 26, 36 and 37) is provided in place of determination element 26.

According to the present embodiment, in addition to the basic function similar to that in the first embodiment shown in FIG. 10, the function, as a gain variable amplifier for amplifying the signal at the IF (Intermediate Frequency) stage as a whole, can also be provided.

Further, since DC offset canceling loop 69 is operated based on the signal output from variable-gain amplifier 70, even if the DC level of the signal output from variable-gain amplifier 70 varies when the gain of variable-gain amplifier 70 is changed, the canceling operation of the DC offset is performed. In this case, thresholds V1 and V2 for detecting DC offset variation are set in accordance with the each gain set in variable-gain amplifier 70 so that the amplitude of the signal output from variable-gain amplifier 70 will fall within the range from V1 to V2.

Moreover, the cutoff frequency of LPF 25 is adjusted in accordance with the high-frequency characteristics of variable-gain amplifier 70 and designed so that the response time of DC offset canceling loop 69 as a whole will become pertinent. It is also possible to omit LPF 25 depending on the high-frequency characteristics of variable-gain amplifier 70.

Furthermore, variable-gain amplifier 70 may be an attenuator. Alternatively, variable-gain amplifier 70 may be replaced by an LPF for channel selection.

Here, the configuration of the present embodiment may be added to variable-gain amplifier 68 of the sixth embodiment. In this case, control is performed so that the product of the gain of variable-gain amplifier 70 and the gain of variable-gain amplifier 68 will become constant. Further, thresholds V1 and V2 for detecting DC offset variation may and should be set in accordance with the product of the gain of variable-gain amplifier 70 and the gain of variable-gain amplifier 68 so that the amplitude of the signal output from variable-gain amplifier 70 will fall within the range from V1 to V2.

THE EIGHTH EMBODIMENT

Figure 39:
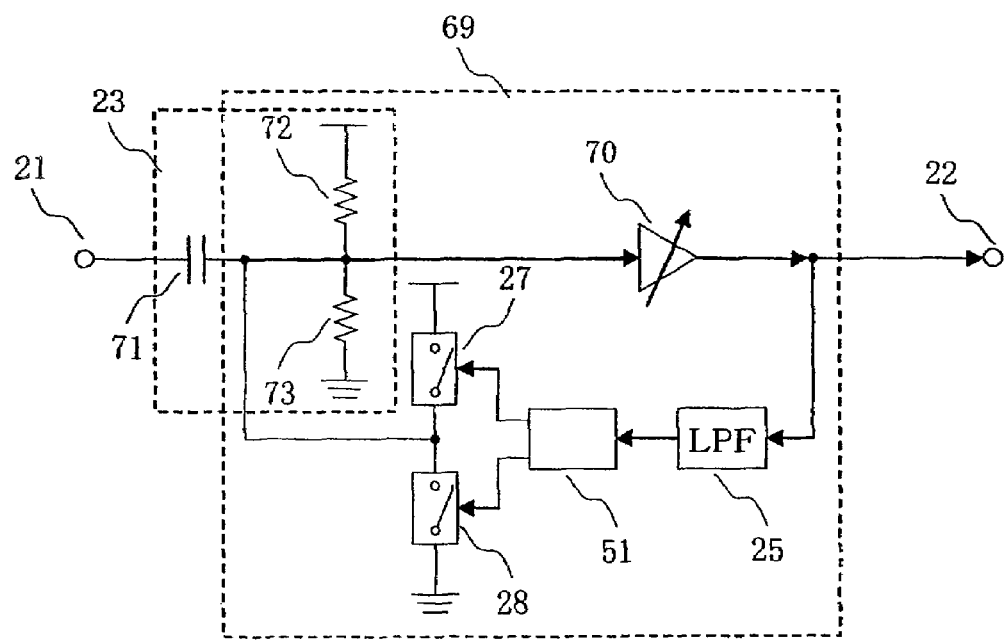
FIG. 39 is a diagram showing a configuration of a signal processing unit in accordance with the eighth embodiment of the present invention.

FIG. 39 shows a configuration of a signal processing unit according to the eighth embodiment of the present invention. When compared to the seventh embodiment shown in FIG. 38, the signal processing unit according to the present embodiment is different in that HPF 23 is replaced by capacitance 71 and in that the bias circuit, connected to the output node of HPF 23, for variable-gain amplifier 70 is composed of resistors 72 and 73.

Also in the present embodiment, in addition to the basic function similar to the first embodiment shown in FIG. 10, the function as a gain variable amplifier for amplifying the signal at the IF stage as a whole can also be provided.

Further, since DC offset canceling loop 69 is operated based on the signal output from variable-gain amplifier 70, even if the DC level of the signal output from variable-gain amplifier 70 varies when the gain of variable-gain amplifier 70 is changed, the canceling operation of the DC offset is performed. In this case, thresholds V1 and V2 for detecting DC offset variation are set in accordance with each gain set in variable-gain amplifier 70 so that the amplitude of the signal output from variable-gain amplifier 70 will fall within the range from V1 to V2.

Moreover, the cutoff frequency of LPF 25 is adjusted in accordance with the high-frequency characteristics of variable-gain amplifier 70 and designed so that the response time of DC offset canceling loop 69 as a whole will become pertinent. It is also possible to omit LPF 25 depending on the high-frequency characteristics of variable-gain amplifier 70.

Furthermore, variable-gain amplifier 70 may be an attenuator. Alternatively, variable-gain amplifier 70 may be replaced by an LPF for channel selection.

THE NINTH EMBODIMENT

Figure 40:
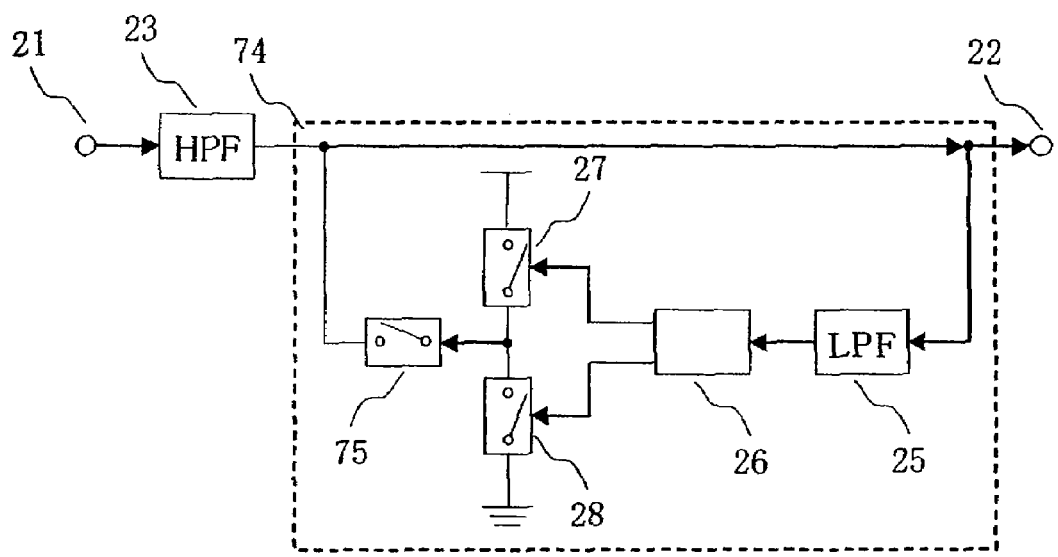
FIG. 40 is a diagram showing a configuration of a signal processing unit in accordance with the ninth embodiment of the present invention.

FIG. 40 shows a configuration of a signal processing unit according to the ninth embodiment of the present invention. When compared to the first embodiment shown in FIG. 10, the signal processing unit according to the present embodiment is different in that DC offset canceling loop 24 is replaced by DC offset canceling loop 74. Detailedly, when compared to DC offset canceling loop 24, DC offset canceling loop 74 is different in that switch 75 as a signal cutoff switch is added between the node of first switch 27 and second switch 28 and the output node of HPF 23. This switch 75 is provided to cut off the device for canceling DC offset (device made up of LPF 25, determination element 26, first switch 27 and second switch 28) from the output node of HPF 23 and to stop the operation of canceling DC offset.

According to the present embodiment, it is possible to select whether or not DC offset canceling loop 74 is operated in accordance with conditions such as the time slot of the received signal and the like. It is apparent that other basic functions are the same as those in the first embodiment shown in FIG. 10.

Although, though in the present embodiment switch 75, as a signal cutoff switch, is added between the node of first switch 27 and second switch 28 and the output node of HPF 23, the configuration here is not limited to this. For example, instead of switch 75 or in addition to switch 75, another signal cutoff switch may be provided between the output node of LPF 25 and the input node of determination element 26.

Next, a specific configuration, in which a signal processing unit according to the present invention is applied to a direct conversion receiver, will be described.

Specific Example 1 of a Direct Conversion Receiver

FIG. 11 shows a configuration of specific example 1 of a direct conversion receiver using a signal processing unit of the present invention. In FIG. 11, only one of the two routes of the branch of the signal having been amplified by LNA 2 is shown (the same also in FIGS. 41 to 43 below).

Figure 1:
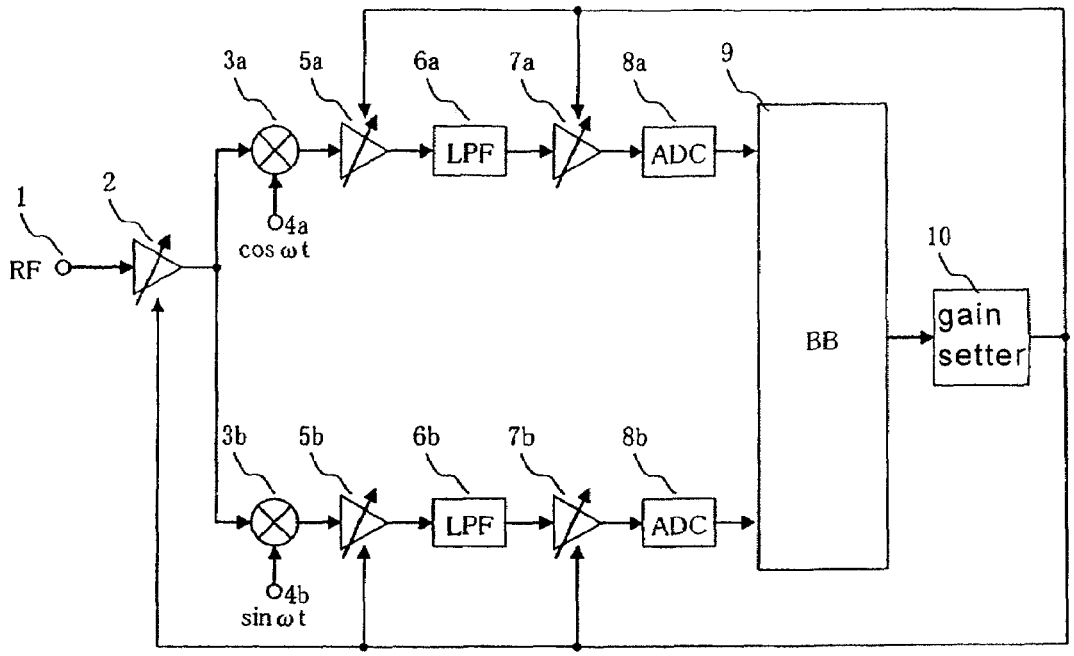
FIG. 1 is a diagram showing a configurational example of a conventional direct conversion receiver.
Figure 2:
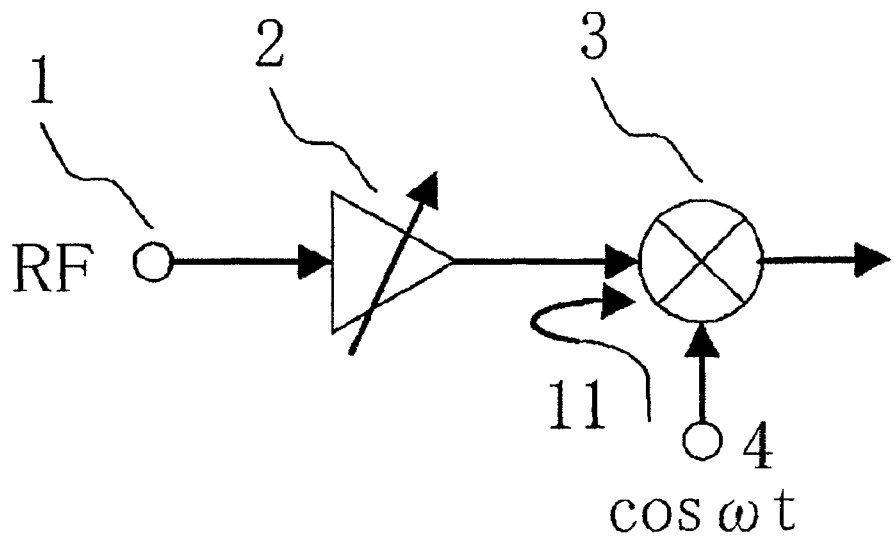
FIG. 2 is a diagram for illustrating one example of a DC offset generation mechanism in a conventional signal processing unit.
Figure 3:
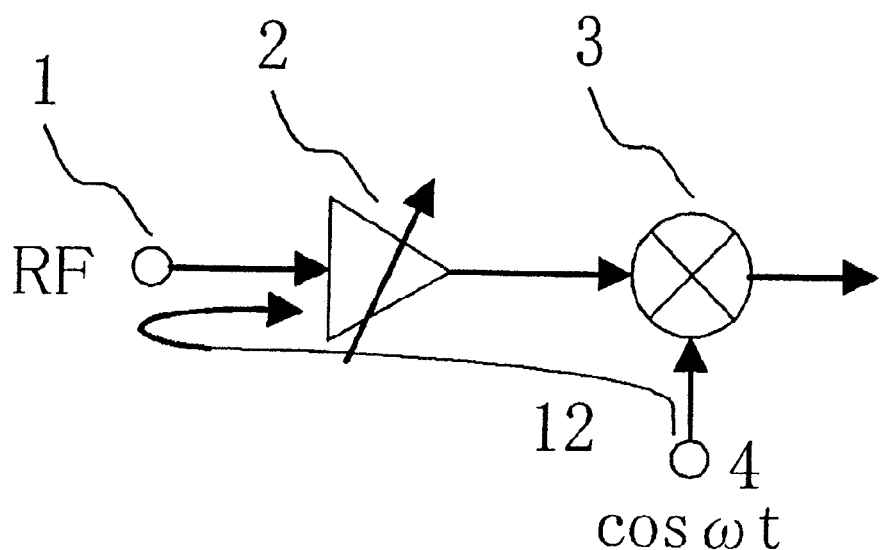
FIG. 3 is a diagram for illustrating another example of a DC offset generation mechanism in a conventional signal processing unit.
Figure 4:
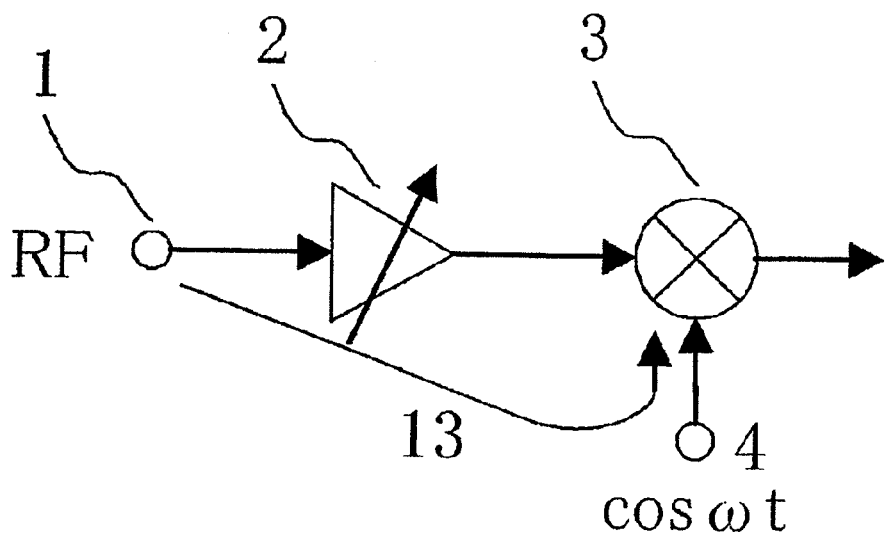
FIG. 4 is a diagram for illustrating another example of a DC offset generation mechanism in a conventional signal processing unit.
Figure 5:
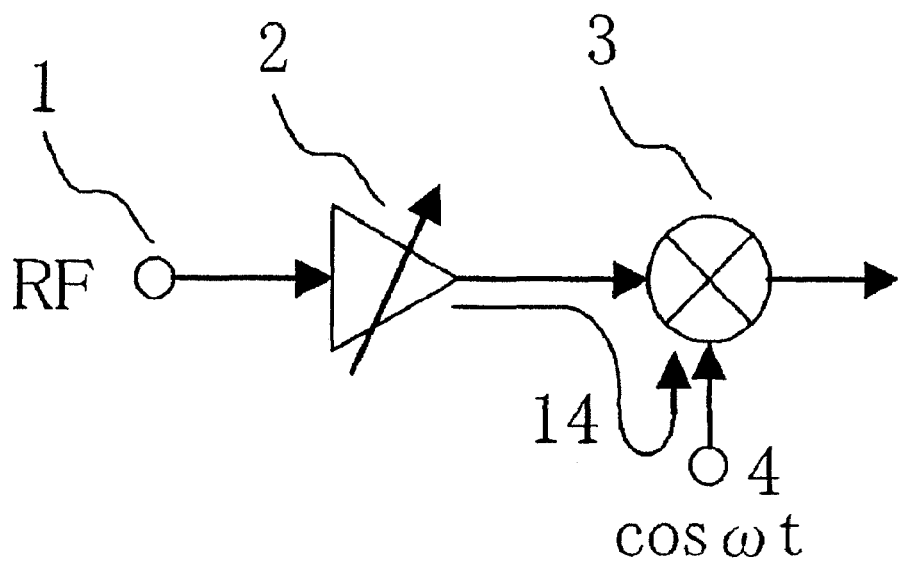
FIG. 5 is a diagram for illustrating another example of a DC offset generation mechanism in a conventional signal processing unit.

When compared to the conventional example shown in FIG. 1, the direct conversion receiver according to the present specific example is different in that HPFs 23a, 23b, 23c and 23d and DC offset canceling loops 24a, 24b, 24c and 24d, which correspond respectively, to HPF 23 and DC offset canceling loop 24 shown in the signal processing units (FIGS. 10, 24 and 25) of the first to third embodiments, are added at input and output stages of variable-gain amplifiers 5 and 7 (corresponding to variable-gain amplifiers 5a and 7a in FIG. 1).

According to the present specific example, it is possible to realize both the transmission without loss of the desired signal component and the countermeasures against dynamic offset, which cannot be realized in the conventional technology using a simple high-pass element. Further, the example is advantageous in that complex ADC and DAC are required, in that there is no need to supply of external control signals synchronous with time slots, and in that DC offset variation in the desired reception time slot can be used.

Specific Example 2 of a Direct Conversion Receiver

Figure 41:
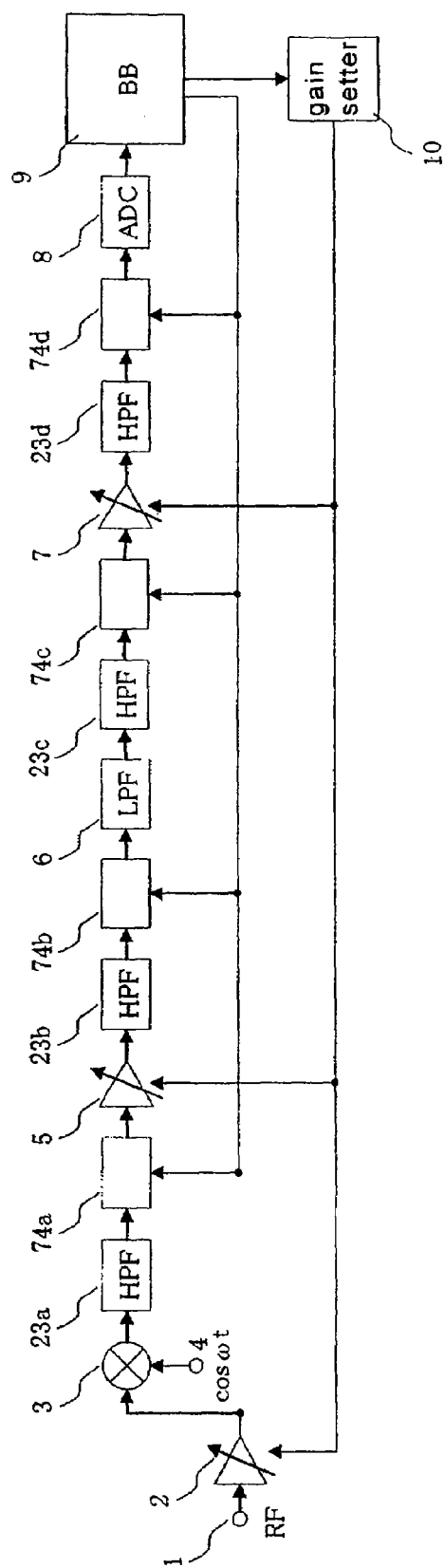
FIG. 41 is a diagram showing a configuration of specific example 2 of a direct conversion receiver using a signal processing unit according to the present invention.

FIG. 41 shows a configuration of specific example 2 of a direct conversion receiver using a signal processing unit of the present invention. When compared to specific example 1 shown in FIG. 11, the direct conversion receiver according to the present specific example is different in that DC offset canceling loops 74a, 74b, 74c and 74d, which correspond to DC offset canceling loop 74 shown in the signal processing unit (FIG. 40) of the ninth embodiment, are provided instead of DC offset canceling loops 24a, 24b, 24c and 24d.

According to the present specific example, in a period in which the gain setting of the entire receiver has not yet been defined such as immediately after the direct conversion receiver is started up, it is possible for example to stop the operation of canceling DC offset by DC offset canceling loop 74d at the subsequent stage of variable-gain amplifier 7. Accordingly, there is no risk of canceling the desired signal component of the output signal by DC offset canceling loop 74 operating when the amplitude of the desired signal becomes too large or too small even though no variation in DC offset. As a result, it is possible to avoid the problem in which baseband signal processor 9 erroneously measures the signal intensity of the received signal and an erroneous signal is sent from gain controller (gain setter) 10 to LNA 2 and to variable-gain amplifiers 5 and 7 to thereby cause erroneous gain setting in the entire receiver. It is apparent that other basic functions are the same as those in specific example 1 shown in FIG. 11.

Specific Example 3 of a Direct Conversion Receiver

Figure 42:
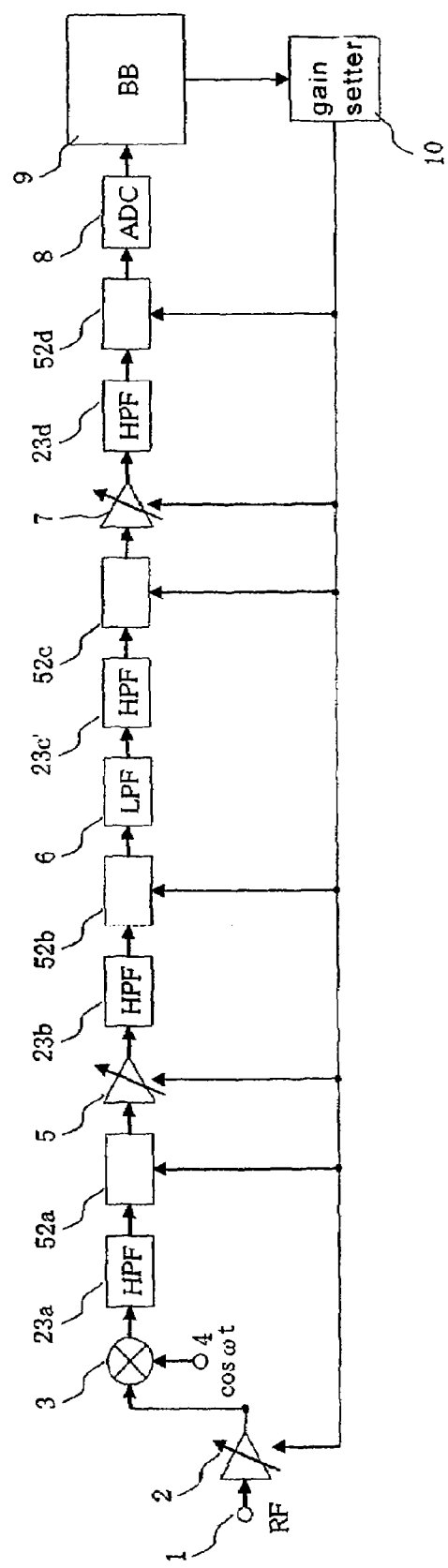
FIG. 42 is a diagram showing a configuration of specific example 3 of a direct conversion receiver using a signal processing unit according to the present invention.

FIG. 42 shows a configuration of specific example 3 of a direct conversion receiver using a signal processing unit of the present invention. When compared to specific example 1 shown in FIG. 11, the direct conversion receiver according to the present specific example is different in that DC offset canceling loops 52a, 52b, 52c and 52d, which correspond to DC offset canceling loop 52 shown in the signal processing units (FIGS. 26, 36 and 37) of the fourth to sixth embodiment, are provided instead of DC offset canceling loops 24a, 24b, 24c and 24d.

According to the present specific example, if the amplitudes of the signals output from HPFs 23a, 23b, 23c and 23d have changed by alteration of the gains in LNA 2 and variable-gain amplifiers 5 and 7, the thresholds of DC offset canceling loops 52a, 52b, 52c and 52d are controlled through control terminal 50, so that there is no risk of canceling the desired signal components of the output signals by operation of DC offset canceling loops 52a, 52b, 52c and 52d. As a result it is possible to deal correctly with DC offset variation. It is apparent that other basic functions are the same as those in specific example 1 shown in FIG. 11.

SPECIFIC EXAMPLE 4 OF A DIRECT CONVERSION RECEIVER

Figure 43:
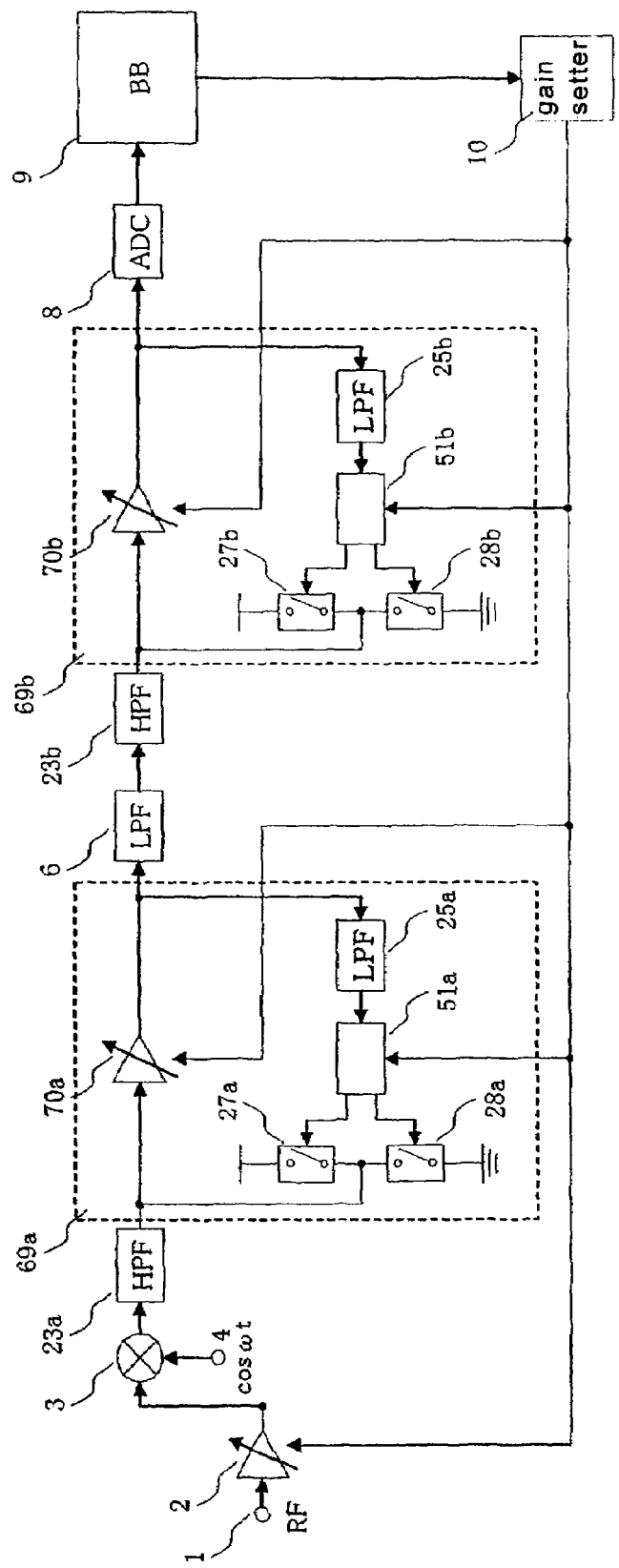
FIG. 43 is a diagram showing a configuration of specific example 4 of a direct conversion receiver using a signal processing unit according to the present invention.

FIG. 43 shows a configuration of specific example 4 of a direct conversion receiver using a signal processing unit of the present invention. When compared to the conventional example shown in FIG. 1, the direct conversion receiver according to the present specific example is different in that HPFs 23a, 23b and DC offset canceling loops 69a and 69b, corresponding to HPF 23 and DC offset 69 (integrated with variable-gain amplifier 70) shown in the signal processing units (FIGS. 28 and 29) of the seventh and eighth embodiments, are added instead of variable-gain amplifiers 5a and 7a.

According to the present specific example, similar to specific example 3 shown in FIG. 42, in addition to the function of adjusting the thresholds for DC offset canceling loops 69a and 69b in accordance with the gains of variable-gain amplifiers 70a and 70b, it is possible to obtain the same functions with a lower number of elements than that of specific example 3. It is apparent that other basic functions are the same as those in specific example 1 shown in FIG. 11.

Although the embodiments of the present invention have been described heretofore, the present invention should not be limited to the above-described embodiments, but needless to say, variations can be made within the range of the technical spirit of the present invention. For example in addition to the aforementioned direct conversion receivers, the present invention can also be applied to a communications device in which DC offset causes a problem.

The invention claimed is:

1. A signal processing unit comprising:
an input terminal to which an input signal is input;
a first element for cutting off the DC component of the input signal;
an output terminal for outputting a signal output from the first element as an output signal;
a determination element for determining whether or not the voltage of the output signal falls out of a predetermined detection threshold range; and,
a switch for connecting the output node of the first element to a power supply circuit when at the determination element the voltage of the output signal was determined to fall out of the detection threshold range.

2. The signal processing unit according to claim 1, wherein the power supply circuit comprises a first power supply circuit and a second power supply circuit,
the switch comprises:
a first switch, one end of which is connected to the first power supply circuit while the other end is connected to the output node of the first element; and
a second switch, one end of which is connected to the second power supply circuit while the other end is connected to the output node of the first element, and
the determination element, when it determined that the voltage of the output signal fell out of the detection threshold range, drives the first switch so as to connect the output node of the first element to the first power supply circuit or drives the second switch so as to connect the output node of the first element to the second power supply circuit.

3. The signal processing unit according to claim 2, wherein the first power supply circuit is a power supply voltage of the signal processing unit.

4. The signal processing unit according to claim 3, wherein the power supply voltage is shared with a power supply voltage for driving the entire signal processing unit.

5. The signal processing unit according to claim 2, wherein the first power supply circuit is a constant voltage source.

6. The signal processing unit according to claim 2, wherein the second power supply circuit is the ground of the signal processing unit.

7. The signal processing unit according to claim 2, wherein the first power supply circuit is a constant current source for flowing out current to the first switch and the second power supply circuit is a constant current source for accepting current from the second switch.

8. The signal processing unit according to claim 2, wherein the determination element includes an n-type MOSFET and a p-type MOSFET which perform source-follower operation and three resistors connected in series between the first power supply circuit and the second power supply circuit;

the node to which the gate terminals of the n-type MOS-FET and the p-type MOSFET are connected in parallel forms the input node of the determination element; and the source terminals of the n-type MOSFET and the p-type MOSFET are connected to two different nodes of the three resistors, and the two nodes constitute the output nodes of the determination element which are respectively connected to the first switch and second switch element.

9. The signal processing unit according to claim 1, further comprising a second element which is provided between the output node of the first element and the output terminal, and amplifies the signal output from the first element and outputs it to the output terminal while the gain is changed by a gain control signal input from without.

10. The signal processing unit according to claim 9, wherein a gain control signal for controlling the gain of a variable-gain amplifier in a down conversion receiver is branched and input to the second element so that the second element changes the gain based on the gain control signal.

11. The signal processing unit according to claim 1, further comprising a third element which is provided between the output terminal and the input node of the determination element, and amplifies the signal output from the first element and outputs it to the determination element while the gain is changed by a gain control signal input from without.

12. The signal processing unit according to claim 11, wherein a gain control signal for controlling the gain of a variable-gain amplifier in a down conversion receiver is branched and input to the second element so that the third element changes the gain based on the gain control signal.

13. The signal processing unit according to claim 1, further comprising: a second element which is provided between the output node of the first element and the output terminal, and amplifies the signal output from the second element and outputs it to the output terminal while the gain is changed by a gain control signal input from without; and a third element which is provided between the output terminal and the input node of the determination element, and amplifies the signal output from the first element and outputs it to the determination element while the gain is changed by a gain control signal input from without.

14. The signal processing unit according to claim 13, wherein the product of the gain of the second element and the gain of the third element is constant.

15. The signal processing unit according to claim 13, wherein a gain control signal for controlling the gain of a variable-gain amplifier in a down conversion receiver is branched and input to the second element so that the second element changes the gain based on the gain control signal.

16. The signal processing unit according to claim 13, wherein a gain control signal for controlling the gain of a variable-gain amplifier in a down conversion receiver is branched and input to the second element so that the third element changes the gain based on the gain control signal.

17. The signal processing unit according to claim 1, wherein the first element is a high-pass filter.

18. The signal processing unit according to claim 1, wherein the first element is a capacitance.

19. The signal processing unit according to claim 1, wherein when the output node of said first element is connected to said power supply circuit by said switch, the time constant, when the current at the output node of said first element is charged or discharged, is shorter than the time constant of said first element.

20. The signal processing unit according to claim 1, further comprising a signal cutoff switch provided between said output terminal and the input node of said determination element or between the output node of said first element and said switch, for cutting off signals.

21. The signal processing unit according to claim 1, further comprising signal cutoff switches provided between said output terminal and the input node of said determination element and between the output node of said first element and said switch, for cutting off signals.

22. The signal processing unit according to claim 1, wherein said determination element includes a control terminal for adjusting said detection threshold range set in the determination element.

23. The signal processing unit according to claim 1, wherein said determination element includes a control terminal for stopping the determining operation from determining whether or not the voltage of the output signal falls out of said detection threshold range.

24. The signal processing unit according to claim 1, wherein said determination element comprises: a first determination element having a first detection threshold range set therein; and a second determination element connected in parallel with said first determination element and having a second detection threshold range set therein which is different from said first detection threshold range, and determines whether or not the voltage of said output signal falls out of the detection threshold range set in the determination element which is selected from said first determination element and second determination element.

25. The signal processing unit according to claim 24, further comprising: switching means provided at the input node or output node of said first determination element and second determination element, respectively for switching to the determination element selected from said first determination element and said second determination element.

26. The signal processing unit according to claim 1, wherein said determination element comprises a plurality of determination elements having detection threshold ranges different from each other, set therein and connected in parallel, and which determines whether or not the voltage of said output signal falls out of the detection threshold range set in the determination element selected from said multiple determination elements.

27. The signal processing unit according to claim 26, further comprising switching means provided at the input nodes or output nodes of said multiple determination elements for switching to the determination element selected from said multiple determination elements.

28. The signal processing unit according to claim 1, further comprising a low-pass filter between the output terminal and the input node of the determination element.

29. The signal processing unit according to claim 1, wherein the determination element includes a CMOS inverter consisting of an n-type MOSFET and a p-type MOSFET, the detection threshold range is adjusted by modifying the current drive capability ratio of the n-type MOSFET and the p-type MOSFET.

30. The signal processing unit according to claim 1, wherein the input terminal is connected to the output node of any one of a mixer, a variable-gain amplifier and a low-pass filter in a down conversion receiver.

31. The signal processing unit according to claim 1, wherein the output terminal is connected to the input node of any one of a variable-gain amplifier and a low-pass filter in a down conversion receiver.

* * * * *